United States Patent
Rawlins et al.

(10) Patent No.: US 9,608,677 B2
(45) Date of Patent: Mar. 28, 2017

(54) SYSTEMS AND METHODS OF RF POWER TRANSMISSION, MODULATION, AND AMPLIFICATION

(71) Applicant: ParkerVision, Inc., Jacksonville, FL (US)

(72) Inventors: Gregory S. Rawlins, Chuluota, FL (US); David F. Sorrells, Middleburg, FL (US)

(73) Assignee: PARKER VISION, INC, Jacksonville, FL (US)

( * ) Notice: Subject to any disclaimer, the term of this patent is extended or adjusted under 35 U.S.C. 154(b) by 0 days.

(21) Appl. No.: 14/797,232

(22) Filed: Jul. 13, 2015

(65) Prior Publication Data

US 2016/0173144 A1  Jun. 16, 2016

Related U.S. Application Data

(63) Continuation of application No. 14/541,201, filed on Nov. 14, 2014, now abandoned, which is a
(Continued)

(51) Int. Cl.
*H04B 1/04* (2006.01)
*H03F 1/02* (2006.01)
(Continued)

(52) U.S. Cl.
CPC ......... *H04B 1/0475* (2013.01); *H03F 1/0266* (2013.01); *H03F 1/56* (2013.01);
(Continued)

(58) Field of Classification Search
CPC . H04B 1/04; H03F 1/0266; H03F 1/56; H03F 3/24; H03F 3/19
(Continued)

(56) References Cited

U.S. PATENT DOCUMENTS 1,882,119 A   10/1932   Chireix
1,946,308 A   2/1934    Chireix
(Continued)

FOREIGN PATENT DOCUMENTS

EP   0 011 464 A2   5/1980
EP   0 471 346 A1   8/1990
(Continued)

OTHER PUBLICATIONS

"Ampliphase AM transmission system," *ABU Technical Review*, No. 33, p. 10-18 (Jul. 1974).
(Continued)

*Primary Examiner* — Pablo Tran
(74) *Attorney, Agent, or Firm* — Thomas F. Presson

(57) ABSTRACT

An apparatus, system, and method are provided for energy conversion. For example, the apparatus can include a trans-impedance node, a reactive element, and a trans-impedance circuit. The reactive element can be configured to transfer energy to the trans-impedance node. The trans-impedance circuit can be configured to receive one or more control signals and to dynamically adjust an impedance of the trans-impedance node. The trans-impedance node, as a result, can operate as an RF power switching supply based on the one or more control signals.

7 Claims, 7 Drawing Sheets

Related U.S. Application Data continuation of application No. 13/442,706, filed on Apr. 9, 2012, now abandoned.

(60) Provisional application No. 61/457,487, filed on Apr. 8, 2011.

(51) Int. Cl.
*H03F 1/56* (2006.01)
*H03F 3/19* (2006.01)
*H03F 3/24* (2006.01)

(52) U.S. Cl.
CPC ............... *H03F 3/19* (2013.01); *H03F 3/24* (2013.01); *H04B 1/04* (2013.01); *H04B 2001/0408* (2013.01)

(58) Field of Classification Search
USPC .......... 455/127.1, 91, 107, 108, 127.3, 125, 455/120–121
See application file for complete search history.

(56) References Cited

U.S. PATENT DOCUMENTS

| | | |
|---|---|---|
| 2,116,667 A | 5/1938 | Chireix |
| 2,210,028 A | 8/1940 | Doherty |
| 2,220,201 A | 11/1940 | Bliss |
| 2,269,518 A | 1/1942 | Chireix et al. |
| 2,282,706 A | 5/1942 | Chireix et al. |
| 2,282,714 A | 5/1942 | Fagot |
| 2,294,800 A | 9/1942 | Price |
| 2,508,524 A | 5/1950 | Lang |
| 2,529,073 A | 11/1950 | Chireix |
| 2,555,039 A | 5/1951 | Bissonette |
| 2,591,749 A | 4/1952 | Villemagne |
| 2,670,404 A | 2/1954 | Chireix |
| 2,677,806 A | 5/1954 | Chireix |
| 2,714,634 A | 8/1955 | Hall |
| 2,734,100 A | 2/1956 | Kendall |
| 2,857,591 A | 10/1958 | Nagel |
| 2,890,280 A | 6/1959 | Feyzeau |
| 2,908,753 A | 10/1959 | Ernyei et al. |
| 2,938,945 A | 5/1960 | France |
| 2,963,933 A | 12/1960 | Bereskin |
| 2,964,622 A | 12/1960 | Fire |
| 2,968,697 A | 1/1961 | Rager, Jr. |
| 3,056,017 A | 9/1962 | Peras |
| 3,078,456 A | 2/1963 | Alpers |
| 3,121,198 A | 2/1964 | Potter |
| 3,154,782 A | 10/1964 | Kagawa et al. |
| 3,170,127 A | 2/1965 | Cramer |
| 3,176,060 A | 3/1965 | Bissonette et al. |
| 3,212,008 A | 10/1965 | Kahn |
| 3,219,862 A | 11/1965 | Kieffert |
| 3,263,019 A | 7/1966 | Hurvitz |
| 3,341,697 A | 9/1967 | Kaufman et al. |
| 3,413,570 A | 11/1968 | Bruene et al. |
| 3,418,595 A | 12/1968 | Loewenstern, Jr. |
| 3,436,686 A | 4/1969 | Vackar |
| 3,437,945 A | 4/1969 | Duncan |
| 3,458,816 A | 7/1969 | O'Brien |
| 3,493,718 A | 2/1970 | Kestner et al. |
| 3,513,352 A | 5/1970 | Souillard |
| 3,525,941 A | 8/1970 | Smith |
| 3,544,697 A | 12/1970 | Munch, Jr. |
| 3,651,429 A | 3/1972 | Ruthroff |
| 3,697,692 A | 10/1972 | Hafler |
| 3,716,730 A | 2/1973 | Cerny, Jr. |
| 3,777,275 A | 12/1973 | Cox |
| 3,789,314 A | 1/1974 | Beurrier |
| 3,815,040 A | 6/1974 | Seidel |
| 3,852,530 A | 12/1974 | Shen |
| 3,852,669 A | 12/1974 | Bowman et al. |
| 3,895,304 A | 7/1975 | Klein |
| 3,896,395 A | 7/1975 | Cox |
| 3,906,390 A | 9/1975 | Rollett |
| 3,909,742 A | 9/1975 | Cox et al. |
| 3,927,379 A | 12/1975 | Cox et al. |
| 3,936,819 A | 2/1976 | Angelle et al. |
| 3,991,343 A | 11/1976 | Delpy |
| 4,090,147 A | 5/1978 | Seidel |
| 4,095,196 A | 6/1978 | Seidel |
| 4,104,946 A | 8/1978 | Peterson |
| 4,151,517 A | 4/1979 | Kelley |
| 4,178,557 A | 12/1979 | Henry |
| 4,229,715 A | 10/1980 | Henry |
| 4,301,490 A | 11/1981 | Nagel et al. |
| 4,346,354 A | 8/1982 | Hanna |
| 4,378,530 A | 3/1983 | Garde |
| 4,433,312 A | 2/1984 | Kahn |
| 4,439,744 A | 3/1984 | Kumar et al. |
| 4,441,080 A | 4/1984 | Saari |
| 4,446,440 A | 5/1984 | Bell |
| 4,485,357 A | 11/1984 | Voorman |
| 4,509,017 A | 4/1985 | Andren et al. |
| 4,511,813 A | 4/1985 | Pan |
| 4,580,111 A | 4/1986 | Swanson |
| 4,584,541 A | 4/1986 | Nossen |
| 4,605,902 A | 8/1986 | Harrington |
| 4,628,286 A | 12/1986 | Nossen |
| 4,682,119 A | 7/1987 | Michel |
| 4,682,149 A | 7/1987 | Larson |
| 4,686,448 A | 8/1987 | Jones et al. |
| 4,687,999 A | 8/1987 | Desperben et al. |
| 4,701,716 A | 10/1987 | Poole |
| 4,717,894 A | 1/1988 | Edwards et al. |
| 4,743,858 A | 5/1988 | Everard |
| 4,780,803 A | 10/1988 | Dede Garcia-Santamaria |
| 4,816,783 A | 3/1989 | Leitch |
| 4,817,116 A | 3/1989 | Akaiwa et al. |
| 4,873,492 A | 10/1989 | Myer |
| 4,951,303 A | 8/1990 | Larson |
| 4,974,236 A | 11/1990 | Gurcan et al. |
| 4,995,055 A | 2/1991 | Weinberger et al. |
| 5,005,419 A | 4/1991 | O'Donnell et al. |
| 5,012,200 A | 4/1991 | Meinzer |
| 5,017,888 A | 5/1991 | Meinzer |
| 5,077,539 A | 12/1991 | Howatt |
| 5,081,673 A | 1/1992 | Engelke et al. |
| 5,093,636 A | 3/1992 | Higgins, Jr. et al. |
| 5,115,203 A | 5/1992 | Krett et al. |
| 5,124,665 A | 6/1992 | McGann |
| 5,164,678 A | 11/1992 | Puri et al. |
| 5,214,670 A | 5/1993 | Ballatore |
| 5,229,735 A | 7/1993 | Quan |
| 5,239,275 A | 8/1993 | Leitch |
| 5,239,686 A | 8/1993 | Downey |
| 5,264,807 A | 11/1993 | Okubo et al. |
| 5,287,069 A | 2/1994 | Okubo et al. |
| 5,302,914 A | 4/1994 | Arntz et al. |
| 5,304,943 A | 4/1994 | Koontz |
| 5,307,069 A | 4/1994 | Evans |
| 5,345,189 A | 9/1994 | Hornak et al. |
| 5,351,288 A | 9/1994 | Engelke et al. |
| 5,365,187 A | 11/1994 | Hornak et al. |
| 5,365,190 A | 11/1994 | Yu et al. |
| 5,404,114 A | 4/1995 | Sager |
| 5,410,280 A | 4/1995 | Linguet et al. |
| 5,420,541 A | 5/1995 | Upton et al. |
| 5,426,641 A | 6/1995 | Afrashteh et al. |
| 5,432,473 A | 7/1995 | Mattila et al. |
| 5,438,591 A | 8/1995 | Oie et al. |
| 5,438,684 A | 8/1995 | Schwent et al. |
| 5,485,120 A | 1/1996 | Anvari |
| 5,490,172 A | 2/1996 | Komara |
| 5,495,500 A | 2/1996 | Jovanovich et al. |
| 5,508,657 A | 4/1996 | Behan |
| 5,515,068 A | 5/1996 | Uragami et al. |
| 5,530,722 A | 6/1996 | Dent |
| 5,541,554 A | 7/1996 | Stengel et al. |
| 5,554,865 A | 9/1996 | Larson |
| 5,559,471 A | 9/1996 | Black |
| 5,568,088 A | 10/1996 | Dent et al. |
| 5,574,967 A | 11/1996 | Dent et al. |

(56) References Cited

U.S. PATENT DOCUMENTS

| | | |
|---|---|---|
| 5,574,992 A | 11/1996 | Cygan et al. |
| 5,612,651 A | 3/1997 | Chethik |
| 5,621,351 A | 4/1997 | Puri et al. |
| 5,631,604 A | 5/1997 | Dent et al. |
| RE35,536 E | 6/1997 | Irissou et al. |
| 5,638,024 A | 6/1997 | Dent et al. |
| 5,678,208 A | 10/1997 | Kowalewski et al. |
| 5,694,433 A | 12/1997 | Dent |
| 5,697,074 A | 12/1997 | Makikallio et al. |
| 5,710,520 A | 1/1998 | Frey |
| 5,719,527 A | 2/1998 | Bateman et al. |
| 5,724,005 A | 3/1998 | Chen et al. |
| 5,732,334 A | 3/1998 | Miyake |
| 5,739,723 A | 4/1998 | Sigmon et al. |
| 5,757,229 A | 5/1998 | Mitzlaff |
| 5,764,704 A | 6/1998 | Shenoi |
| 5,767,750 A | 6/1998 | Yamaji |
| 5,770,971 A | 6/1998 | McNicol |
| 5,784,412 A | 7/1998 | Ichihara |
| 5,784,689 A | 7/1998 | Kobayashi |
| 5,786,727 A | 7/1998 | Sigmon |
| 5,792,956 A | 8/1998 | Li |
| 5,805,640 A | 9/1998 | O'Dea et al. |
| 5,815,531 A | 9/1998 | Dent |
| 5,835,128 A | 11/1998 | Macdonald et al. |
| 5,841,876 A | 11/1998 | Gifford et al. |
| 5,854,571 A | 12/1998 | Pinckley et al. |
| 5,862,460 A | 1/1999 | Rich |
| 5,872,481 A | 2/1999 | Sevic et al. |
| 5,877,643 A | 3/1999 | Drogi |
| 5,880,633 A | 3/1999 | Leizerovich et al. |
| 5,886,573 A | 3/1999 | Kolanek |
| 5,886,575 A | 3/1999 | Long |
| 5,890,051 A | 3/1999 | Schlang et al. |
| 5,892,394 A | 4/1999 | Wu |
| 5,892,395 A | 4/1999 | Stengel et al. |
| 5,901,346 A | 5/1999 | Stengel et al. |
| 5,903,854 A | 5/1999 | Abe et al. |
| 5,933,766 A | 8/1999 | Dent |
| 5,949,283 A | 9/1999 | Proctor et al. |
| 5,952,947 A | 9/1999 | Nussbaum et al. |
| 5,956,097 A | 9/1999 | Nguyen et al. |
| 5,963,091 A | 10/1999 | Chen et al. |
| 5,973,559 A | 10/1999 | Alberty |
| 5,973,568 A | 10/1999 | Shapiro et al. |
| 5,974,041 A | 10/1999 | Kornfeld et al. |
| 5,990,734 A | 11/1999 | Wright et al. |
| 5,990,738 A | 11/1999 | Wright et al. |
| 5,999,046 A | 12/1999 | Kotzamanis |
| 6,011,830 A | 1/2000 | Sasin et al. |
| 6,026,286 A | 2/2000 | Long |
| 6,028,485 A | 2/2000 | Sigmon et al. |
| 6,043,707 A | 3/2000 | Budnik |
| 6,054,894 A | 4/2000 | Wright et al. |
| 6,054,896 A | 4/2000 | Wright et al. |
| 6,057,798 A | 5/2000 | Burrier et al. |
| 6,069,525 A | 5/2000 | Sevic et al. |
| 6,072,361 A | 6/2000 | Myers et al. |
| 6,085,074 A | 7/2000 | Cygan |
| 6,097,252 A | 8/2000 | Sigmon et al. |
| 6,104,991 A * | 8/2000 | Newland ............ G10L 19/0204 704/201 |
| 6,111,461 A | 8/2000 | Matsuno |
| 6,111,462 A | 8/2000 | Mucenieks et al. |
| 6,115,368 A | 9/2000 | Schilling |
| 6,125,266 A | 9/2000 | Matero et al. |
| 6,130,910 A | 10/2000 | Anderson et al. |
| 6,130,916 A | 10/2000 | Thomson |
| 6,133,788 A | 10/2000 | Dent |
| 6,133,789 A | 10/2000 | Braithwaite |
| 6,137,355 A | 10/2000 | Sevic et al. |
| 6,147,553 A | 11/2000 | Kolanek |
| 6,154,093 A | 11/2000 | Chen et al. |
| 6,157,253 A | 12/2000 | Sigmon et al. |
| 6,169,455 B1 | 1/2001 | Yamaguchi |
| 6,175,747 B1 | 1/2001 | Tanishima et al. |
| 6,181,199 B1 | 1/2001 | Camp, Jr. et al. |
| 6,188,277 B1 | 2/2001 | Borodulin et al. |
| 6,198,416 B1 | 3/2001 | Velazquez |
| 6,201,452 B1 | 3/2001 | Dent et al. |
| 6,204,735 B1 | 3/2001 | Cairns |
| 6,215,354 B1 | 4/2001 | Kolanek et al. |
| 6,232,835 B1 | 5/2001 | Braithwaite |
| 6,232,838 B1 | 5/2001 | Sugimoto |
| 6,236,688 B1 | 5/2001 | Ohta et al. |
| 6,242,975 B1 | 6/2001 | Eidson et al. |
| 6,246,286 B1 | 6/2001 | Persson |
| 6,246,599 B1 | 6/2001 | Jang et al. |
| 6,252,461 B1 | 6/2001 | Raab |
| 6,256,482 B1 | 7/2001 | Raab |
| 6,259,320 B1 | 7/2001 | Valk et al. |
| 6,285,251 B1 | 9/2001 | Dent et al. |
| 6,292,054 B1 | 9/2001 | Ma et al. |
| 6,295,442 B1 | 9/2001 | Camp, Jr. et al. |
| 6,300,828 B1 | 10/2001 | McInnis |
| 6,304,545 B1 | 10/2001 | Armbruster et al. |
| 6,307,894 B2 | 10/2001 | Eidson et al. |
| 6,311,045 B1 | 10/2001 | Domokos |
| 6,311,046 B1 | 10/2001 | Dent |
| 6,313,703 B1 | 11/2001 | Wright et al. |
| 6,337,599 B2 | 1/2002 | Lee |
| 6,342,812 B1 | 1/2002 | Abdollahian et al. |
| 6,349,216 B1 | 2/2002 | Alberth, Jr. et al. |
| 6,351,189 B1 | 2/2002 | Hirvilampi |
| 6,359,506 B1 | 3/2002 | Camp, Jr. et al. |
| 6,359,508 B1 | 3/2002 | Mucenieks |
| 6,359,513 B1 | 3/2002 | Kuo et al. |
| 6,366,177 B1 | 4/2002 | McCune et al. |
| 6,369,651 B2 | 4/2002 | Dent |
| 6,373,901 B1 | 4/2002 | O'Dea et al. |
| 6,373,902 B1 | 4/2002 | Park et al. |
| 6,374,092 B1 | 4/2002 | Leizerovich et al. |
| 6,380,802 B1 | 4/2002 | Pehike et al. |
| 6,384,680 B1 | 5/2002 | Takei et al. |
| 6,384,681 B1 | 5/2002 | Bonds |
| 6,385,439 B1 | 5/2002 | Hellberg |
| 6,388,513 B1 | 5/2002 | Wright et al. |
| 6,392,483 B2 | 5/2002 | Suzuki et al. |
| 6,396,341 B1 | 5/2002 | Pehlke |
| 6,396,347 B1 | 5/2002 | Lie et al. |
| 6,404,823 B1 | 6/2002 | Grange et al. |
| 6,407,635 B2 | 6/2002 | Mucenieks et al. |
| 6,411,655 B1 | 6/2002 | Holden et al. |
| 6,421,389 B1 | 7/2002 | Jett et al. |
| 6,424,216 B2 | 7/2002 | Mu et al. |
| 6,434,122 B2 | 8/2002 | Barabash et al. |
| 6,437,644 B1 | 8/2002 | Kenington |
| 6,449,465 B1 | 9/2002 | Gailus et al. |
| 6,452,446 B1 | 9/2002 | Eisenberg et al. |
| 6,459,334 B2 | 10/2002 | Wright et al. |
| 6,459,337 B1 | 10/2002 | Goren et al. |
| 6,462,617 B1 | 10/2002 | Kim |
| 6,469,581 B1 | 10/2002 | Kobayashi |
| 6,470,431 B2 | 10/2002 | Nicosia et al. |
| 6,472,934 B1 | 10/2002 | Pehlke |
| 6,472,937 B1 | 10/2002 | Gerard et al. |
| 6,476,670 B1 | 11/2002 | Wright et al. |
| 6,496,062 B1 | 12/2002 | Nitz et al. |
| 6,501,331 B2 | 12/2002 | Adar |
| 6,504,428 B2 | 1/2003 | Cova et al. |
| 6,504,447 B1 | 1/2003 | Laney et al. |
| 6,507,731 B1 | 1/2003 | Hasegawa |
| 6,510,309 B1 | 1/2003 | Thompson et al. |
| 6,510,310 B1 | 1/2003 | Muralidharan |
| 6,512,416 B2 | 1/2003 | Burns et al. |
| 6,522,194 B1 | 2/2003 | Pehlke |
| 6,522,198 B2 | 2/2003 | Ahn |
| 6,522,201 B1 | 2/2003 | Hsiao et al. |
| 6,525,605 B2 | 2/2003 | Hu et al. |
| 6,529,773 B1 | 3/2003 | Dewan |
| 6,531,935 B1 | 3/2003 | Russat et al. |
| 6,535,060 B2 | 3/2003 | Goren et al. |
| 6,538,509 B2 | 3/2003 | Ren |
| 6,538,793 B2 | 3/2003 | Rosenberg et al. |

(56) References Cited

U.S. PATENT DOCUMENTS

| | | |
|---|---|---|
| 6,545,535 B2 | 4/2003 | Andre |
| 6,552,634 B1 | 4/2003 | Raab |
| 6,566,944 B1 | 5/2003 | Pehlke et al. |
| 6,577,199 B2 | 6/2003 | Dent |
| 6,577,691 B2 | 6/2003 | Richards et al. |
| 6,583,679 B1 | 6/2003 | Cox et al. |
| 6,583,739 B1 | 6/2003 | Kenington |
| 6,586,995 B1 | 7/2003 | Tachibana |
| 6,587,010 B2 | 7/2003 | Wagh et al. |
| 6,587,511 B2 | 7/2003 | Barak et al. |
| 6,587,514 B1 | 7/2003 | Wright et al. |
| 6,587,913 B2 | 7/2003 | Campanale et al. |
| 6,593,806 B1 | 7/2003 | Melanson |
| 6,600,368 B2 | 7/2003 | Kim |
| 6,603,352 B2 | 8/2003 | Wight |
| 6,606,483 B1 | 8/2003 | Baker et al. |
| 6,614,854 B1 | 9/2003 | Chow et al. |
| 6,622,198 B2 | 9/2003 | Jones, Jr. |
| 6,624,694 B2 | 9/2003 | Ma et al. |
| 6,633,200 B2 | 10/2003 | Kolanek |
| 6,636,112 B1 | 10/2003 | McCune |
| 6,637,030 B1 | 10/2003 | Klein |
| 6,646,505 B2 | 11/2003 | Anderson |
| 6,647,073 B2 | 11/2003 | Tapio |
| 6,653,896 B2 | 11/2003 | Sevic et al. |
| 6,672,167 B2 | 1/2004 | Buell et al. |
| 6,674,326 B1 | 1/2004 | Hiramoto et al. |
| 6,678,041 B2 | 1/2004 | Kimura et al. |
| 6,681,101 B1 | 1/2004 | Eidson et al. |
| 6,683,918 B2 | 1/2004 | Jackson et al. |
| 6,690,232 B2 | 2/2004 | Ueno et al. |
| 6,690,233 B2 | 2/2004 | Sander |
| 6,697,436 B1 | 2/2004 | Wright et al. |
| 6,697,603 B1 | 2/2004 | Lovinggood et al. |
| 6,700,440 B2 | 3/2004 | Hareyama |
| 6,700,441 B1 | 3/2004 | Zhang et al. |
| 6,700,453 B2 | 3/2004 | Heiskala et al. |
| 6,701,419 B2 | 3/2004 | Tomaiuolo et al. |
| 6,707,338 B2 | 3/2004 | Kenington et al. |
| 6,714,776 B1 | 3/2004 | Birleson |
| 6,724,252 B2 | 4/2004 | Ngo et al. |
| 6,735,424 B1 | 5/2004 | Larson et al. |
| 6,737,914 B2 | 5/2004 | Gu |
| 6,737,916 B2 | 5/2004 | Luu |
| 6,741,840 B2 | 5/2004 | Nagode et al. |
| 6,741,867 B1 | 5/2004 | Tetsuya |
| 6,750,707 B2 | 6/2004 | Takei et al. |
| 6,751,265 B1 | 6/2004 | Schell et al. |
| 6,757,526 B1 | 6/2004 | Sharp et al. |
| 6,763,062 B1 | 7/2004 | Kohno et al. |
| 6,765,519 B2 | 7/2004 | Karlquist |
| 6,781,534 B2 | 8/2004 | Karlquist |
| 6,784,732 B2 | 8/2004 | Hajimiri et al. |
| 6,784,837 B2 | 8/2004 | Revankar et al. |
| 6,785,342 B1 | 8/2004 | Isaksen et al. |
| 6,791,408 B2 | 9/2004 | Goren et al. |
| 6,791,410 B2 | 9/2004 | Kim et al. |
| 6,794,934 B2 | 9/2004 | Betti-Berutto et al. |
| 6,794,938 B2 | 9/2004 | Weldon |
| 6,798,377 B1 | 9/2004 | Lupash et al. |
| 6,798,843 B1 | 9/2004 | Wright et al. |
| 6,801,086 B1 | 10/2004 | Chandrasekaran |
| 6,801,567 B1 | 10/2004 | Schmidl et al. |
| 6,806,767 B2 | 10/2004 | Dow |
| 6,806,789 B2 | 10/2004 | Bawell et al. |
| 6,819,171 B2 | 11/2004 | Kenington |
| 6,819,176 B1 | 11/2004 | Lee |
| 6,819,720 B1 | 11/2004 | Willetts |
| 6,825,719 B1 | 11/2004 | Barak et al. |
| 6,829,471 B2 | 12/2004 | White et al. |
| 6,831,491 B2 | 12/2004 | Karlquist |
| 6,834,183 B2 | 12/2004 | Black et al. |
| 6,836,183 B2 | 12/2004 | Wight |
| 6,838,942 B1 | 1/2005 | Somerville et al. |
| 6,842,070 B2 | 1/2005 | Nilsson |
| 6,847,266 B2 | 1/2005 | Laney et al. |
| 6,853,244 B2 | 2/2005 | Robinson et al. |
| 6,853,247 B2 | 2/2005 | Weldon |
| 6,853,248 B2 | 2/2005 | Weldon |
| 6,859,098 B2 | 2/2005 | Husseini |
| 6,864,742 B2 | 3/2005 | Kobayashi |
| 6,867,647 B2 | 3/2005 | Wouters |
| 6,873,211 B1 | 3/2005 | Thompson et al. |
| 6,879,209 B2 | 4/2005 | Grundlingh |
| 6,882,217 B1 | 4/2005 | Mueller |
| 6,882,711 B1 | 4/2005 | Nicol |
| 6,882,829 B2 | 4/2005 | Mostov et al. |
| 6,889,034 B1 | 5/2005 | Dent |
| 6,891,432 B2 | 5/2005 | Nagle et al. |
| 6,900,694 B2 | 5/2005 | Suzuki et al. |
| 6,906,585 B2 | 6/2005 | Weldon |
| 6,914,487 B1 | 7/2005 | Doyle et al. |
| 6,917,244 B2 | 7/2005 | Rosnell et al. |
| 6,917,389 B2 | 7/2005 | Lee |
| 6,924,699 B2 | 8/2005 | Ahmed |
| 6,928,272 B2 | 8/2005 | Doi |
| 6,930,547 B2 | 8/2005 | Chandrasekaran et al. |
| 6,937,096 B2 | 8/2005 | Wight et al. |
| 6,937,102 B2 | 8/2005 | Lopez et al. |
| 6,940,349 B2 | 9/2005 | Hellberg |
| 6,943,624 B2 | 9/2005 | Ohnishi et al. |
| 6,947,713 B2 | 9/2005 | Checoury et al. |
| 6,960,956 B2 | 11/2005 | Pehlke et al. |
| 6,970,040 B1 | 11/2005 | Dening |
| 6,975,177 B2 | 12/2005 | Varis et al. |
| 6,980,780 B2 | 12/2005 | Chen et al. |
| 6,987,954 B2 | 1/2006 | Nielsen |
| 6,990,323 B2 | 1/2006 | Prikhodko et al. |
| 6,993,301 B1 | 1/2006 | Kenington et al. |
| 7,010,276 B2 | 3/2006 | Sander et al. |
| 7,015,752 B2 | 3/2006 | Saed |
| 7,023,272 B2 | 4/2006 | Hung et al. |
| 7,026,871 B2 | 4/2006 | Saèd |
| 7,030,714 B2 | 4/2006 | Korol |
| 7,031,382 B2 | 4/2006 | Hessel et al. |
| 7,034,613 B2 | 4/2006 | Saèd |
| 7,035,607 B2 | 4/2006 | Lim et al. |
| 7,042,283 B2 | 5/2006 | Suzuki et al. |
| 7,042,286 B2 | 5/2006 | Meade et al. |
| 7,043,208 B2 | 5/2006 | Nigra |
| 7,043,213 B2 | 5/2006 | Robinson et al. |
| 7,054,296 B1 | 5/2006 | Sorrells et al. |
| 7,054,597 B2 | 5/2006 | Rosnell |
| 7,057,461 B1 | 6/2006 | Canilao et al. |
| 7,064,607 B2 | 6/2006 | Maclean et al. |
| 7,068,099 B2 | 6/2006 | Versteegen |
| 7,068,101 B2 | 6/2006 | Saèd et al. |
| 7,068,103 B2 | 6/2006 | Lind |
| 7,071,774 B2 | 7/2006 | Hellberg |
| 7,071,777 B2 | 7/2006 | McBeath et al. |
| 7,078,976 B2 | 7/2006 | Blednov |
| 7,081,795 B2 | 7/2006 | Matsuura et al. |
| 7,084,702 B1 | 8/2006 | Ichitsubo et al. |
| 7,088,970 B2 | 8/2006 | Williams |
| 7,091,775 B2 | 8/2006 | Ichitsubo et al. |
| 7,091,777 B2 | 8/2006 | Lynch |
| 7,092,675 B2 | 8/2006 | Lim et al. |
| 7,092,676 B2 | 8/2006 | Abdelgany et al. |
| 7,099,382 B2 | 8/2006 | Aronson et al. |
| 7,103,328 B2 | 9/2006 | Zelley |
| 7,132,900 B2 | 11/2006 | Yahagi et al. |
| 7,139,535 B2 | 11/2006 | Zschunke |
| 7,145,397 B2 | 12/2006 | Yamamoto et al. |
| 7,173,980 B2 * | 2/2007 | Masenten ............ H03M 3/334 375/316 |
| 7,177,418 B2 | 2/2007 | Maclean et al. |
| 7,184,723 B2 | 2/2007 | Sorrells et al. |
| 7,193,459 B1 | 3/2007 | Epperson et al. |
| 7,197,284 B2 | 3/2007 | Brandt et al. |
| 7,200,369 B2 | 4/2007 | Kim et al. |
| 7,230,996 B2 | 6/2007 | Matsuura et al. |
| 7,242,245 B2 | 7/2007 | Burns et al. |
| 7,248,841 B2 | 7/2007 | Agee et al. |
| 7,260,368 B1 | 8/2007 | Blumer |

(56) References Cited

U.S. PATENT DOCUMENTS

| | | |
|---|---|---|
| 7,260,369 B2 | 8/2007 | Feher |
| 7,292,189 B2 | 11/2007 | Orr et al. |
| 7,327,803 B2 | 2/2008 | Sorrells et al. |
| 7,345,534 B2 | 3/2008 | Grebennikov |
| 7,345,629 B2 | 3/2008 | Dulmovits et al. |
| 7,349,673 B2 | 3/2008 | Moloudi et al. |
| 7,355,470 B2 | 4/2008 | Sorrells et al. |
| 7,378,902 B2 | 5/2008 | Sorrells et al. |
| 7,382,182 B2 | 6/2008 | Trocke et al. |
| 7,403,579 B2 | 7/2008 | Jaffe et al. |
| 7,414,469 B2 | 8/2008 | Sorrells et al. |
| 7,421,036 B2 | 9/2008 | Sorrells et al. |
| 7,423,477 B2 | 9/2008 | Sorrells et al. |
| 7,428,230 B2 | 9/2008 | Park |
| 7,436,894 B2 | 10/2008 | Norris |
| 7,440,733 B2 | 10/2008 | Maslennikov et al. |
| 7,459,893 B2 | 12/2008 | Jacobs |
| 7,460,612 B2 | 12/2008 | Eliezer et al. |
| 7,466,760 B2 | 12/2008 | Sorrells et al. |
| 7,474,695 B2 | 1/2009 | Liu et al. |
| 7,486,894 B2 | 2/2009 | Aronson et al. |
| 7,502,599 B2 | 3/2009 | Ben-Ayun et al. |
| 7,509,102 B2 | 3/2009 | Rofougaran et al. |
| 7,526,261 B2 | 4/2009 | Sorrells et al. |
| 7,560,984 B2 | 7/2009 | Akizuki et al. |
| 7,616,057 B2 * | 11/2009 | Sutardja .................. H03F 1/08 250/214 A |
| 7,620,129 B2 | 11/2009 | Sorrells et al. |
| 7,639,072 B2 | 12/2009 | Sorrells et al. |
| 7,647,030 B2 | 1/2010 | Sorrells et al. |
| 7,672,648 B1 | 3/2010 | Groe et al. |
| 7,672,650 B2 | 3/2010 | Sorrells et al. |
| 7,738,853 B2 | 6/2010 | Eddy et al. |
| 7,750,733 B2 | 7/2010 | Sorrells et al. |
| RE41,582 E | 8/2010 | Larson et al. |
| 7,778,320 B2 * | 8/2010 | Agazzi ................ H03M 1/0626 375/229 |
| 7,835,709 B2 | 11/2010 | Sorrells et al. |
| 7,844,235 B2 | 11/2010 | Sorrells et al. |
| 7,885,682 B2 | 2/2011 | Sorrells et al. |
| 7,907,671 B2 | 3/2011 | Klomsdorf et al. |
| 7,911,272 B2 | 3/2011 | Sorrells et al. |
| 7,929,989 B2 | 4/2011 | Sorrells et al. |
| 7,932,776 B2 | 4/2011 | Sorrells et al. |
| 7,937,106 B2 | 5/2011 | Sorrells et al. |
| 7,945,224 B2 | 5/2011 | Sorrells et al. |
| 7,949,365 B2 | 5/2011 | Sorrells et al. |
| 7,978,390 B2 | 7/2011 | Kikuchi |
| 8,013,675 B2 | 9/2011 | Sorrells et al. |
| 8,026,764 B2 | 9/2011 | Sorrells et al. |
| 8,031,804 B2 | 10/2011 | Sorrells et al. |
| 8,036,306 B2 | 10/2011 | Sorrells et al. |
| 8,050,353 B2 | 11/2011 | Sorrells et al. |
| 8,059,749 B2 | 11/2011 | Sorrells et al. |
| 8,073,078 B2 | 12/2011 | Kaczman et al. |
| 8,170,081 B2 | 5/2012 | Forenza et al. |
| 8,223,885 B2 | 7/2012 | Zhu et al. |
| 8,233,858 B2 | 7/2012 | Sorrells et al. |
| 8,280,321 B2 | 10/2012 | Sorrells et al. |
| 8,315,336 B2 | 11/2012 | Sorrells et al. |
| 8,334,722 B2 | 12/2012 | Sorrells et al. |
| 8,351,870 B2 | 1/2013 | Sorrells et al. |
| 8,355,466 B2 | 1/2013 | Kleider et al. |
| 8,369,807 B2 * | 2/2013 | Mikhemar ............... H04B 1/38 375/320 |
| 8,384,484 B2 | 2/2013 | Winslow et al. |
| 8,406,711 B2 | 3/2013 | Sorrells et al. |
| 8,410,849 B2 | 4/2013 | Sorrells et al. |
| 8,428,527 B2 | 4/2013 | Sorrells et al. |
| 8,433,264 B2 | 4/2013 | Sorrells et al. |
| 8,433,745 B2 * | 4/2013 | Roger .................. H03F 1/3211 708/819 |
| 8,447,248 B2 | 5/2013 | Sorrells et al. |
| 8,461,924 B2 | 6/2013 | Rawlins et al. |
| 8,502,600 B2 | 8/2013 | Rawlins et al. |
| 8,548,093 B2 | 10/2013 | Sorrells et al. |
| 8,577,313 B2 | 11/2013 | Sorrells et al. |
| 8,626,093 B2 | 1/2014 | Sorrells et al. |
| 8,639,196 B2 | 1/2014 | Sorrells et al. |
| 8,755,454 B2 | 6/2014 | Sorrells et al. |
| 8,766,717 B2 | 7/2014 | Sorrells et al. |
| 8,781,418 B2 | 7/2014 | Sorrells et al. |
| 8,884,694 B2 | 11/2014 | Sorrells et al. |
| 8,913,691 B2 | 12/2014 | Sorrells et al. |
| 8,913,974 B2 | 12/2014 | Sorrells et al. |
| 2001/0001008 A1 | 5/2001 | Dent |
| 2001/0004373 A1 | 6/2001 | Hirata |
| 2001/0006354 A1 | 7/2001 | Lee |
| 2001/0006359 A1 | 7/2001 | Suzuki et al. |
| 2001/0011961 A1 | 8/2001 | Rexberg et al. |
| 2001/0030581 A1 | 10/2001 | Dent |
| 2001/0052816 A1 | 12/2001 | Ahn |
| 2002/0008577 A1 | 1/2002 | Cova et al. |
| 2002/0027958 A1 | 3/2002 | Kolanek |
| 2002/0042253 A1 | 4/2002 | Dartois |
| 2002/0047745 A1 | 4/2002 | Kolanek |
| 2002/0053973 A1 | 5/2002 | Ward, Jr. |
| 2002/0058486 A1 | 5/2002 | Persson |
| 2002/0071497 A1 | 6/2002 | Bengtsson et al. |
| 2002/0079962 A1 | 6/2002 | Sander |
| 2002/0084845 A1 | 7/2002 | Eisenberg et al. |
| 2002/0086707 A1 | 7/2002 | Struhsaker et al. |
| 2002/0094034 A1 | 7/2002 | Moriyama |
| 2002/0101907 A1 | 8/2002 | Dent et al. |
| 2002/0105378 A1 | 8/2002 | Tapio |
| 2002/0105384 A1 | 8/2002 | Dent |
| 2002/0125947 A1 | 9/2002 | Ren |
| 2002/0126769 A1 | 9/2002 | Jett et al. |
| 2002/0127986 A1 | 9/2002 | White et al. |
| 2002/0130716 A1 | 9/2002 | Larson et al. |
| 2002/0130727 A1 | 9/2002 | Nagasaka |
| 2002/0130729 A1 | 9/2002 | Larson et al. |
| 2002/0136275 A1 | 9/2002 | Wight |
| 2002/0136325 A1 | 9/2002 | Pehlke et al. |
| 2002/0146996 A1 | 10/2002 | Bachman, II et al. |
| 2002/0153950 A1 | 10/2002 | Kusunoki et al. |
| 2002/0159532 A1 | 10/2002 | Wight |
| 2002/0164965 A1 | 11/2002 | Chominski et al. |
| 2002/0168025 A1 | 11/2002 | Schwent et al. |
| 2002/0171478 A1 | 11/2002 | Wouters |
| 2002/0171485 A1 | 11/2002 | Cova |
| 2002/0172376 A1 | 11/2002 | Bizjak |
| 2002/0180547 A1 | 12/2002 | Staszewski et al. |
| 2002/0183021 A1 | 12/2002 | Brandt |
| 2002/0186079 A1 | 12/2002 | Kobayashi |
| 2002/0191638 A1 | 12/2002 | Wang et al. |
| 2002/0196864 A1 | 12/2002 | Booth et al. |
| 2003/0006845 A1 | 1/2003 | Lopez et al. |
| 2003/0031268 A1 | 2/2003 | Wight |
| 2003/0041667 A1 | 3/2003 | White |
| 2003/0083026 A1 | 5/2003 | Liu |
| 2003/0087625 A1 | 5/2003 | Conti |
| 2003/0098753 A1 | 5/2003 | Wagh et al. |
| 2003/0102910 A1 | 6/2003 | Sevic et al. |
| 2003/0102914 A1 | 6/2003 | Kenington et al. |
| 2003/0107435 A1 | 6/2003 | Gu |
| 2003/0114124 A1 | 6/2003 | Higuchi |
| 2003/0118121 A1 | 6/2003 | Makinen |
| 2003/0119526 A1 | 6/2003 | Edge |
| 2003/0123566 A1 | 7/2003 | Hasson |
| 2003/0125065 A1 | 7/2003 | Barak et al. |
| 2003/0132800 A1 | 7/2003 | Kenington |
| 2003/0143967 A1 | 7/2003 | Ciccarelli et al. |
| 2003/0179041 A1 | 9/2003 | Weldon |
| 2003/0190895 A1 | 10/2003 | Mostov et al. |
| 2003/0201835 A1 | 10/2003 | Dening et al. |
| 2003/0210096 A1 | 11/2003 | Pengelly et al. |
| 2003/0210746 A1 | 11/2003 | Asbeck et al. |
| 2003/0219067 A1 | 11/2003 | Birkett et al. |
| 2003/0220086 A1 | 11/2003 | Birkett |
| 2003/0228856 A1 | 12/2003 | Orihashi et al. |
| 2003/0231057 A1 | 12/2003 | Hiramoto et al. |
| 2004/0008081 A1 | 1/2004 | Friedel et al. |
| 2004/0021517 A1 | 2/2004 | Irvine et al. |

(56) References Cited

U.S. PATENT DOCUMENTS

| | | |
|---|---|---|
| 2004/0025104 A1 | 2/2004 | Amer |
| 2004/0027198 A1 | 2/2004 | Chandrasekaran et al. |
| 2004/0037363 A1 | 2/2004 | Norsworthy et al. |
| 2004/0037378 A1 | 2/2004 | Komori et al. |
| 2004/0046524 A1 | 3/2004 | Zschunke |
| 2004/0052312 A1 | 3/2004 | Matero |
| 2004/0056723 A1 | 3/2004 | Gotou |
| 2004/0062397 A1 | 4/2004 | Amer |
| 2004/0075492 A1 | 4/2004 | Wight |
| 2004/0076238 A1 | 4/2004 | Parker et al. |
| 2004/0085134 A1 | 5/2004 | Griffith et al. |
| 2004/0092281 A1 | 5/2004 | Burchfiel |
| 2004/0095192 A1 | 5/2004 | Krvavac |
| 2004/0101065 A1 | 5/2004 | Hagh et al. |
| 2004/0108896 A1 | 6/2004 | Midtgaard |
| 2004/0113698 A1 | 6/2004 | Kim et al. |
| 2004/0119477 A1 | 6/2004 | Kazemi-Nia |
| 2004/0119514 A1 | 6/2004 | Karlquist |
| 2004/0119622 A1 | 6/2004 | Karlquist |
| 2004/0119624 A1 | 6/2004 | Karlquist |
| 2004/0125006 A1 | 7/2004 | Tani et al. |
| 2004/0131131 A1 | 7/2004 | Peach et al. |
| 2004/0135630 A1 | 7/2004 | Hellberg |
| 2004/0142667 A1 | 7/2004 | Lochhead et al. |
| 2004/0146116 A1 | 7/2004 | Kang et al. |
| 2004/0166813 A1 | 8/2004 | Mann et al. |
| 2004/0169559 A1 | 9/2004 | Weldon |
| 2004/0172583 A1 | 9/2004 | Amer |
| 2004/0174213 A1 | 9/2004 | Thompson |
| 2004/0181745 A1 | 9/2004 | Amer |
| 2004/0184559 A1 | 9/2004 | Ballantyne |
| 2004/0185805 A1 | 9/2004 | Kim et al. |
| 2004/0189380 A1 | 9/2004 | Myer et al. |
| 2004/0189381 A1 | 9/2004 | Louis |
| 2004/0196899 A1 | 10/2004 | Zhou et al. |
| 2004/0198263 A1 | 10/2004 | Ode et al. |
| 2004/0222851 A1 | 11/2004 | Weldon |
| 2004/0224715 A1 | 11/2004 | Rosenlof et al. |
| 2004/0227570 A1 | 11/2004 | Jackson et al. |
| 2004/0233599 A1 | 11/2004 | Busking |
| 2004/0246060 A1 | 12/2004 | Varis et al. |
| 2004/0251962 A1 | 12/2004 | Rosnell et al. |
| 2004/0263242 A1 | 12/2004 | Hellberg |
| 2004/0263245 A1 | 12/2004 | Winter et al. |
| 2004/0263246 A1 | 12/2004 | Robinson et al. |
| 2004/0266059 A1 | 12/2004 | Wight et al. |
| 2004/0266365 A1 | 12/2004 | Hasson et al. |
| 2004/0266368 A1 | 12/2004 | Rosnell |
| 2004/0266374 A1 | 12/2004 | Saed et al. |
| 2004/0267399 A1 | 12/2004 | Funk |
| 2005/0001674 A1 | 1/2005 | Saed et al. |
| 2005/0001675 A1 | 1/2005 | Saed |
| 2005/0001676 A1 | 1/2005 | Saed |
| 2005/0001677 A1 | 1/2005 | Saed |
| 2005/0001678 A1 | 1/2005 | Saed |
| 2005/0001679 A1 | 1/2005 | Saed |
| 2005/0002470 A1 | 1/2005 | Saed et al. |
| 2005/0003770 A1 | 1/2005 | Saed |
| 2005/0007194 A1 | 1/2005 | Grundlingh |
| 2005/0012547 A1 | 1/2005 | Kwon et al. |
| 2005/0018787 A1 | 1/2005 | Saed |
| 2005/0024262 A1 | 2/2005 | Cantrell et al. |
| 2005/0025181 A1 | 2/2005 | Nazari |
| 2005/0047038 A1 | 3/2005 | Nakajima et al. |
| 2005/0058059 A1 | 3/2005 | Amer |
| 2005/0058193 A1 | 3/2005 | Saed |
| 2005/0058209 A1 | 3/2005 | Magrath |
| 2005/0058227 A1 | 3/2005 | Birkett et al. |
| 2005/0058228 A1 | 3/2005 | Birkett |
| 2005/0073360 A1 | 4/2005 | Johnson et al. |
| 2005/0073374 A1 | 4/2005 | Korol |
| 2005/0088226 A1 | 4/2005 | Robinson et al. |
| 2005/0110590 A1 | 5/2005 | Korol |
| 2005/0111574 A1 | 5/2005 | Muller et al. |
| 2005/0118973 A1 | 6/2005 | Khlat |
| 2005/0129140 A1 | 6/2005 | Robinson |
| 2005/0129141 A1 | 6/2005 | Lee |
| 2005/0136864 A1 | 6/2005 | Zipper |
| 2005/0141640 A1 | 6/2005 | Maruyama |
| 2005/0181746 A1 | 8/2005 | Wight |
| 2005/0191976 A1 | 9/2005 | Shakeshaft et al. |
| 2005/0195031 A1 | 9/2005 | Grundlingh |
| 2005/0201483 A1 | 9/2005 | Coersmeier |
| 2005/0215206 A1 | 9/2005 | Granstrom et al. |
| 2005/0227646 A1 | 10/2005 | Yamazaki et al. |
| 2005/0242879 A1 | 11/2005 | Muller |
| 2005/0253652 A1 | 11/2005 | Song et al. |
| 2005/0253745 A1 | 11/2005 | Song et al. |
| 2005/0260956 A1 | 11/2005 | Loraine et al. |
| 2006/0006946 A1 | 1/2006 | Burns et al. |
| 2006/0017500 A1 | 1/2006 | Hellberg |
| 2006/0035618 A1 | 2/2006 | Pleasant |
| 2006/0052068 A1 | 3/2006 | Sander et al. |
| 2006/0052124 A1 | 3/2006 | Pottenger et al. |
| 2006/0055458 A1 | 3/2006 | Shiikuma et al. |
| 2006/0066396 A1 | 3/2006 | Brandt |
| 2006/0068707 A1 | 3/2006 | Greeley |
| 2006/0088081 A1 | 4/2006 | Withington et al. |
| 2006/0142821 A1 | 6/2006 | Bange et al. |
| 2006/0160502 A1 | 7/2006 | Kintis |
| 2006/0220625 A1 | 10/2006 | Chapuis |
| 2006/0238245 A1 | 10/2006 | Carichner et al. |
| 2006/0262889 A1 | 11/2006 | Kalvaitis et al. |
| 2006/0264190 A1 | 11/2006 | Aleiner |
| 2006/0291589 A1 | 12/2006 | Eliezer et al. |
| 2006/0292999 A1 | 12/2006 | Sorrells et al. |
| 2006/0293000 A1 | 12/2006 | Sorrells et al. |
| 2007/0019757 A1 | 1/2007 | Matero |
| 2007/0021080 A1 | 1/2007 | Kuriyama et al. |
| 2007/0030063 A1 | 2/2007 | Izumi et al. |
| 2007/0050758 A1 | 3/2007 | Arevalo et al. |
| 2007/0071114 A1 | 3/2007 | Sanderford et al. |
| 2007/0076814 A1 | 4/2007 | Ikeda et al. |
| 2007/0082630 A1 | 4/2007 | Aridas et al. |
| 2007/0087708 A1 | 4/2007 | Sorrells et al. |
| 2007/0087709 A1 | 4/2007 | Sorrells et al. |
| 2007/0090874 A1 | 4/2007 | Sorrells et al. |
| 2007/0096806 A1 | 5/2007 | Sorrells et al. |
| 2007/0111686 A1 | 5/2007 | Lee |
| 2007/0127563 A1 | 6/2007 | Wu et al. |
| 2007/0155344 A1 | 7/2007 | Wiessner et al. |
| 2007/0184790 A1 | 8/2007 | Gilbertson et al. |
| 2007/0190952 A1 | 8/2007 | Waheed et al. |
| 2007/0194986 A1 | 8/2007 | Dulmovits, Jr. et al. |
| 2007/0218852 A1 | 9/2007 | Huynh |
| 2007/0247217 A1 | 10/2007 | Sorrells et al. |
| 2007/0247220 A1 | 10/2007 | Sorrells et al. |
| 2007/0247221 A1 | 10/2007 | Sorrells et al. |
| 2007/0248156 A1 | 10/2007 | Sorrells et al. |
| 2007/0248185 A1 | 10/2007 | Sorrells et al. |
| 2007/0248186 A1 | 10/2007 | Sorrells et al. |
| 2007/0249299 A1 | 10/2007 | Sorrells et al. |
| 2007/0249300 A1 | 10/2007 | Sorrells et al. |
| 2007/0249301 A1 | 10/2007 | Sorrells et al. |
| 2007/0249302 A1 | 10/2007 | Sorrells et al. |
| 2007/0249304 A1 | 10/2007 | Snelgrove et al. |
| 2007/0291668 A1 | 12/2007 | Duan |
| 2008/0003960 A1 | 1/2008 | Zolfaghari |
| 2008/0019459 A1 | 1/2008 | Chen et al. |
| 2008/0072025 A1 | 3/2008 | Staszewski et al. |
| 2008/0089252 A1 | 4/2008 | Choi |
| 2008/0133982 A1 | 6/2008 | Rawlins et al. |
| 2008/0225929 A1 | 9/2008 | Proctor et al. |
| 2008/0225935 A1 | 9/2008 | Reddy |
| 2008/0259846 A1 | 10/2008 | Gonikberg et al. |
| 2008/0272841 A1 | 11/2008 | Sorrells et al. |
| 2008/0299913 A1 | 12/2008 | Han et al. |
| 2008/0311860 A1 | 12/2008 | Tanaka et al. |
| 2009/0004981 A1 | 1/2009 | Eliezer et al. |
| 2009/0063070 A1 | 3/2009 | Renneberg |
| 2009/0070568 A1 | 3/2009 | Shi et al. |
| 2009/0091384 A1 | 4/2009 | Sorrells et al. |
| 2009/0134947 A1 | 5/2009 | Tarng |
| 2009/0201084 A1 | 8/2009 | See et al. |

(56) References Cited

U.S. PATENT DOCUMENTS

| | | |
|---|---|---|
| 2009/0227214 A1 | 9/2009 | Georgantas et al. |
| 2009/0232260 A1 | 9/2009 | Hayashi et al. |
| 2009/0238249 A1 | 9/2009 | van Waasen et al. |
| 2009/0262861 A1 | 10/2009 | Nielsen |
| 2009/0262877 A1 | 10/2009 | Shi et al. |
| 2010/0008680 A1 | 1/2010 | Chen et al. |
| 2010/0013527 A1 | 1/2010 | Warnick |
| 2010/0075623 A1* | 3/2010 | Rawlins ............... H03F 1/0294 455/207 |
| 2010/0103052 A1 | 4/2010 | Ying |
| 2010/0311353 A1 | 12/2010 | Teillet et al. |
| 2010/0329395 A1 | 12/2010 | Kang et al. |
| 2011/0099406 A1 | 4/2011 | Bell |
| 2011/0300885 A1* | 12/2011 | Darabi .................. H04B 1/52 455/500 |
| 2012/0025624 A1 | 2/2012 | Lee et al. |
| 2012/0153731 A9 | 6/2012 | Kirby et al. |
| 2012/0263215 A1 | 10/2012 | Peng |
| 2012/0321007 A1 | 12/2012 | Feher |
| 2013/0077708 A1* | 3/2013 | Sorrells ................. H04B 1/04 375/295 |
| 2013/0078934 A1 | 3/2013 | Rawlins et al. |
| 2013/0101074 A1 | 4/2013 | Hickling |
| 2013/0122973 A1 | 5/2013 | Caskey |
| 2013/0279631 A1 | 10/2013 | Bowers et al. |
| 2015/0071383 A1 | 3/2015 | Rawlins et al. |

FOREIGN PATENT DOCUMENTS

| | | |
|---|---|---|
| EP | 0 630 104 A2 | 12/1994 |
| EP | 0 708 546 A2 | 4/1996 |
| EP | 0 471 346 B1 | 11/1996 |
| EP | 0 639 307 B1 | 12/1997 |
| EP | 0 821 304 A1 | 1/1998 |
| EP | 0 725 478 B1 | 8/1998 |
| EP | 0 892 529 A2 | 1/1999 |
| EP | 0 897 213 A1 | 2/1999 |
| EP | 0 598 585 B1 | 3/1999 |
| EP | 0 630 104 B1 | 8/2000 |
| EP | 0 821 304 B1 | 2/2002 |
| EP | 1 068 666 B1 | 5/2003 |
| EP | 1 381 154 A1 | 1/2004 |
| EP | 0 897 213 B1 | 3/2004 |
| EP | 1 487 100 A1 | 12/2004 |
| EP | 1 332 550 B1 | 3/2005 |
| EP | 1 142 250 B1 | 4/2005 |
| EP | 1 521 359 A1 | 4/2005 |
| EP | 1 583 228 A2 | 10/2005 |
| GB | 2159374 A | 11/1985 |
| GB | 2 267 402 | 12/1993 |
| JP | 54-022749 A | 2/1979 |
| JP | 60-63517 A | 4/1985 |
| JP | 1-284106 A | 11/1989 |
| JP | 2-87708 A | 3/1990 |
| JP | 3-232307 A | 10/1991 |
| JP | 3-247101 | 11/1991 |
| JP | 3-276923 | 12/1991 |
| JP | 4-095409 A | 3/1992 |
| JP | 4-104604 A | 4/1992 |
| JP | 5-22046 A | 1/1993 |
| JP | 5-037263 A | 2/1993 |
| JP | 6-338728 A | 12/1994 |
| JP | H08-163189 A | 6/1996 |
| JP | 9-018536 A | 1/1997 |
| JP | 9-074320 A | 3/1997 |
| JP | 10-70451 A | 3/1998 |
| JP | 2000-209291 A | 7/2000 |
| JP | 2000-244261 A | 9/2000 |
| JP | 2001-136057 A | 5/2001 |
| JP | 2001-217659 A | 8/2001 |
| JP | 2001-308650 A | 11/2001 |
| JP | 2002-543729 A | 12/2002 |
| JP | 2003-298357 A | 10/2003 |
| JP | 2003-298361 A | 10/2003 |
| JP | 2004-260707 A | 9/2004 |
| JP | 2005-101940 A | 4/2005 |
| JP | 2005-151543 A | 6/2005 |
| RO | 102824 | 11/1991 |
| RO | 100466 | 8/1992 |
| SU | 1322183 A1 | 7/1987 |
| WO | WO 94/21035 | 9/1994 |
| WO | WO 96/10310 | 4/1996 |
| WO | WO 96/19063 | 6/1996 |
| WO | WO 97/41642 | 11/1997 |
| WO | WO 97/48219 | 12/1997 |
| WO | WO 99/23755 | 5/1999 |
| WO | WO 99/52206 | 10/1999 |
| WO | WO 00/41371 | 7/2000 |
| WO | WO 00/67370 A1 | 11/2000 |
| WO | WO 01/03292 | 1/2001 |
| WO | WO 01/45205 | 6/2001 |
| WO | WO 01/91282 | 11/2001 |
| WO | WO 02/39577 | 5/2002 |
| WO | WO 02/082633 | 10/2002 |
| WO | WO 02/084864 A2 | 10/2002 |
| WO | WO 03/047093 | 6/2003 |
| WO | WO 03/061115 | 7/2003 |
| WO | WO 2004/023647 | 3/2004 |
| WO | WO 2004/036736 | 4/2004 |
| WO | WO 2004/057755 | 7/2004 |
| WO | WO 2005/031966 | 4/2005 |
| WO | WO 2005/036732 | 4/2005 |
| WO | WO 2005/055413 | 6/2005 |

OTHER PUBLICATIONS

"Designing an SSB Outphaser," *Electronics World*, pp. 306-310 (Apr. 1996).
"New 50 KW Ampliphase AM Transmitter," *RCA in Broadcast News*, No. 111, pp. 36-39 (Jun. 1961).
*The Ampliphase Page*: Ampliphase—A quick description . . . , Reproduction of text from http://rossrevenge.co.uk/tx/ampli.htm, 13 pages (visited Jan. 18, 2006).
Ajluni, C., "Chip Set Withstands WLAN's Future Blows," at http://www.wsdmag.com/Articles/Print.cfm?ArticleID=6792, 5 pages (Oct. 2003).
Ampen-Darko, S. and Al-Raweshidy, H.S., "Gain/phase imbalance cancellation technique in LINC transmitters," *Electronics Letters*, vol. 34, No. 22, pp. 2093-2094 (Oct. 29, 1988).
Ampen-Darko, S.O. and Al-Raweshidy, H.S., "A Novel Technique for Gain/Phase Cancellation in LINC Transmitters," *IEEE VTS—50$^{th}$ Vehicular Technology Conference*, Amsterdam, pp. 2034-2038 (Sep. 19-22, 1999).
Andreani, P., *Linear PA architectures (Chapter 13)*, available at http://server.oersted.dtu.dk/personal/pa/31636/pdf/paLin.pdf, 10 pages (Jun. 14, 2007).
Ariyavisitakul, S. and Lie, T.P., "Characterizing the Effects of Nonlinear Amplifiers on Linear Modulation for Digital Portable Radio Communications," *IEEE Transactions on Vehicular Technology*, vol. 39, No. 4, pp. 383-389 (Nov. 1990).
*ARMMS—The RF and Microwave Society—Last Meeting*, at http://www.armms.org/last.html, 4 pages (printed Apr. 14, 2005).
Asbeck, P.M. et al., "Power Amplifier Approaches for High Efficiency and Linearity," in Itoh, T. et al. (eds.), *RF Technologies for Low Power Wireless Communications*, ISBN No. 0-471-38267-1, pp. 189-227 (2001).
Asbeck, P.M. et al., "Synergistic Design of DSP and Power Amplifiers for Wireless Communications," *IEEE Transactions on Microwave Theory and Techniques*, vol. 49, No. 11, pp. 2163-2169 (Nov. 2001).
Banelli, P., "Error Sensitivity in Adaptive Predistortion Systems," *Global Telecommunications Conference—Globecom '99*, pp. 883-888 (1999).
Bateman, A., et al., "The Application of Digital Signal Processing to Transmitter Linearisation," *EUROCON 88: 8$^{th}$ European Conference on Electrotechnics*, pp. 64-67 (Jun. 13-17, 1988).
Bespalov, V.B. and Aslamazyan, A.S., "Broadband Strip-Line SHF Ampliphasemeter," *Measurement Techniques (Translated from Russian)*, vol. 25, No. 8, pp. 712-715 (Aug. 1982).

(56) References Cited

OTHER PUBLICATIONS

Birafane, A. and Kouki, A., "An Analytical Approach to LINC Power Combining Efficiency Estimation and Optimization," *33rd European Microwave Conference—Munich*, pp. 1227-1229 (2003).
Birafane, A. and Kouki, A., "Distortion Free LINC Amplifier with Chireix-Outphasing Combiner Using Phase-Only Predistortion," *34th European Microwave Conference—Amsterdam*, pp. 1069-1072 (2004).
Birafane, A. and Kouki, A., "On the Linearity and Efficiency of Outphasing Microwave Amplifiers," *IEEE Transactions on Microwave Theory and Techniques*, vol. 52, No. 7, pp. 1702-1708 (Jul. 2004).
Birafane, A. and Kouki, A., "Sources of Linearity Degradation in LINC Transmitters for Hybrid and Outphasing Combiners," *Canadian Conference on Electrical and Computer Engineering—Niagara Falls*, pp. 547-550 (May 2004).
Birafane, A. and Kouki, A.B., "Phase-Only Predistortion for LINC Amplifiers With Chireix-Outphasing Combiners," *IEEE Transactions on Microwave Theory and Techniques*, vol. 53, No. 6, pp. 2240-2250 (Jun. 2005).
Breed, G., "Intermodulation Distortion Performance and Measurement Issues," *High Frequency Electronics*, p. 56(2) (May 2003).
Bruckmann, H., "Modulation Arrangements and Operating Costs of Broadcasting and Radio-Telephony Transmitters," *Telegraphen-Fernsprech-Funk-und Fernsehtechnik*, vol. 24, pp. 83-91 (Apr. 1935).
Burnill, J., "Transmitting AM," *Electronics World + Wireless World*, pp. 58-60 (Jan. 1995).
Casadevall, F. and Olmos, J.J., "On the Behavior of the LINC Transmitter," *40th IEEE Vehicular Technology Conference*, pp. 29-34 (May 6-9, 1990).
Casadevall, F.J. and Valdovinos, A., "Performance Analysis of QAM Modulations Applied to the LINC Transmitter," *IEEE Transactions on Vehicular Technology*, vol. 42, No. 4, pp. 399-406 (Nov. 1993).
Casadevall, F.J., "The LINC Transmitter", *RF Design*, pp. 41-48 (Feb. 1990).
Cha, J. et al., "Highly Efficient Power Amplifier for CDMA Base Stations Using Doherty Configuration," *IEEE MTT-S International Microwave Symposium Digest*, pp. 533-536 (2004).
Chan, K.Y. et al., "Analysis and Realisation of the LINC Transmitter using the Combined Analogue Locked Loop Universal Modulator (CALLUM),"*IEEE 44th Vehicular Technology Conference*, vol. 1, pp. 484-488 (Jun. 8-10, 1994).
Chen, J.-T. et al., "The Optimal RLS Parameter Tracking Algorithm for a Power Amplifier Feedforward Linearizer," *IEEE Transactions on Circuits and Systems—II: Analog and Digital Signal Processing*, vol. 46, No. 4, pp. 464-468 (Apr. 1999).
Chireix, H., "High Power Outphasing Modulation" *Proceedings of the Institute of Radio Engineers*, vol. 23, No. 11, pp. 1370-1392 (Nov. 1935).
Choi, L.U., *Multi-user MISO and MIMO Transmit Signal Processing for Wireless Communication*, PhD Thesis submitted to the Hong Kong University of Science and Technology, 191 pages, Mar. 2003.
Clark, G., "A Comparison of AM Techniques," *ABU Technical Review*, No. 44, p. 33-42, (May 1976).
Clark, G., "A Comparison of Current Broadcast Amplitude Modulation Techniques", *IEEE Transactions on Broadcasting*, vol. BC-21, No. 2, pp. 25-31 (Jun. 1975).
Clifton, J.C. et al., "Novel Multimode J-pHEMT Front-End Architecture With Power-Control Scheme for Maximum Efficiency," *IEEE Transactions on Microwave Theory and Techniques*, vol. 53, No. 6, pp. 2251-2258 (Jun. 2005).
Colantonio, P., "High Linearity and Efficiency Microwave PAs," *12th GAAS Symposium—Amsterdam*, pp. 183-186 (2004).
*Computational Science Research Center Colloquium—Time Reversal Bases Communications in Complex Environments*, Friday, Apr. 9, 2004, 2 pages, printed Jul. 14, 2006 from http://www.sdsunivers.info_content_event.asp?id=15044.
Conradi, C.P. et al., "Evaluation of a Lossless Combiner in a LINC Transmitter," *Proceedings of the 1999 IEEE Canadian Conference on Electrical Computer Engineering*, pp. 105-110 (May 9-12, 1999).
Couch, L. and Walker, J.L., "A VHF LINC Amplifier," *Proceedings of IEEE Southeastcon*, pp. 122-125 (1982).
*Course #08: Advanced RF Power Amplifier Techniques for Modern Wireless and Microwave Systems*, from http://www.cei.se/008.htm, 6 pages (printed Apr. 14, 2005).
*Course #114: Advanced RF Power Amplifier Techniques*, from http://www.bessercourse.com/outlinesOnly.asp?CTID=114, 3 pages (printed Jun. 22, 2005).
Cox, "Component Signal Separation and Recombination for Linear Amplification with Nonlinear Components," *IEEE Transactions on Communications*, vol. COM-23, No. 11, pp. 1281-1287 (Nov. 1975).
Cox, D.C. and Leck, R.P., "A VHF Implementation of a LINC Amplifier," *IEEE Transactions on Communications*, pp. 1018-1022 (Sep. 1976).
Cox, D.C., "Linear Amplification with Nonlinear Components," *IEEE Transactions on Communications*, vol. COM-22, pp. 1942-1945 (Dec. 1974).
Cripps, S.C., *Advanced Techniques in RF Power Amplifier Design*, Section 2—"Doherty and Chireix," pp. 33-72, Artech House (2002).
Cripps, Steve C., *PA Linearisation in RFICs . . . ignoring the obvious?*, available at http://www.cei.se/pa_milan.ppt, Hywave Associates, 24 pages (Created Aug. 2, 2001).
Cripps, Steve C., *RF Power Amplifiers for Wireless Communications*, Artech House, ISBN No. 0890069891, pp. 240-250 (Apr. 1999).
Deltimple, N. et al., "A Reconfigurable RF Power Amplifier Biasing Scheme", *Proceedings of the 2nd Annual IEEE Northeast Workshop on Circuits and Systems (NEWCAS2004)*, pp. 365-368, (Jun. 20-23, 2004).
Dennis, A., "A Novel Digital Transmitter Architecture for Multimode/Multiband Applications: DTX, A Technology of MACOM," Tyco Electronics, 32 pages (Aug. 17, 2004).
Dinis, R. et al., "Performance Trade-Offs with Quasi-Linearly Amplified OFDM Through a Two-Branch Combining Technique," *IEEE 46th Vehicular Technology Conference*, pp. 899-903 (Apr. 28-May 1, 1996).
Ellinger, F. et al., "Calibratable Adaptive Antenna Combiner at 5.2 GHz with High Yield for Laptop Interface Card," *IEEE Transactions on Microwave Theory and Techniques*, vol. 48, No. 12, pp. 2714-2720 (Dec. 2000).
Faust, H.H. et al., "A Spectrally Clean Transmitting System for Solid-State Phased-Array Radars," *Proceedings of the 2004 IEEE Radar Conference*, pp. 140-144 (Apr. 26-Apr. 29, 2004).
Fisher, S.T., "A New Method of Amplifying with High Efficiency a Carrier Wave Modulated in Amplitude by a Voice Wave," *Proceedings of the Institute of Radio Engineers*, vol. 34, pp. 3P-13P (Jan. 1946).
Garcia, P. et al., "An Adaptive Digital Method of Imbalances Cancellation in LINC Transmitters," *IEEE Transactions on Vehicular Technology*, vol. 54, No. 3, pp. 879-888 (May 2005).
Gaudernack, L.F., "A Phase-Opposition System of Amplitude Modulation," *IRE Proceedings*, vol. 26, No. 8, pp. 983-1008 (Aug. 1938).
Gentzler, C.G. and Leong, S.K., "Broadband VHF/UHF Amplifier Design Using Coaxial Transformers," *High Frequency Electronics*, pp. 42, 44, 46, 48, 50, and 51 (May 2003).
Gerhard, W. and Knöchel, R., "Digital Component Separator for future W-CDMA-LINC Transmitters implemented on an FPGA," *Advances in Radio Science*, 3, pp. 239-246 (2005).
Gründlingh, J. et al., "A High Efficiency Chireix Out-phasing Power Amplifier for 5GHz WLAN Applications," *IEEE MTT-S International Microwave Symposium Digest*, vol. 3, pp. 1535-1538 (2004).
Hakala, I. et al., "A 2.14-GHz Chireix Outphasing Transmitter," *IEEE Transactions on Microwave Theory and Techniques*, vol. 53, No. 6, pp. 2129-2138 (Jun. 2005).
Hakala, I. et al., "Chireix Power Combining with Saturated Class-B Power Amplifiers," *Conference Proceedings, 34th European Microwave Conference*, pp. 379-382 (2004).

(56) References Cited

OTHER PUBLICATIONS

Hamedi-Hagh, S. and Salama, A.T., "CMOS Wireless Phase-Shifted Transmitter," *IEEE Journal of Solid-State Circuits*, vol. 39, No. 8, pp. 1241-1252 (Aug. 2004).
Hammond, R. and Henry, J., "High Power Vector Summation Switching Power Amplifier Development," *IEEE Power Electronics Specialists Conference (PESC)*, pp. 267-272 (Jun. 29-Jul. 3, 1981).
Heiden, D., "Principle of a phase constant and low distortion amplitude modulation system for transistor transmitters," *Nachrichtentechnische Zeitschrift*, vol. 23, No. 12, pp. 608-612 (Dec. 1970).
Hetzel, S.A. et al., "LINC Transmitter," *Electronics Letters*, vol. 27, No. 10, pp. 844-846 (May 9, 1991).
Internet Postings at *"Class E-AM Forum" :: View topic—What exactly is class D?*, at http://classe.monkeypuppet.com/viewtopic.php?t=220, 6 pages (Dec. 14-17, 2003).
Iwamoto, M. et al., "An Extended Doherty Amplifier with High Efficiency Over a Wide Power Range," *IEEE Transactions on Microwave Theory and Techniques*, vol. 49, No. 12, pp. 2472-2479 (Dec. 2001).
Jeong, Y.-C., *Linearizing Principles on High Power Amplifier*, Chonbuk National University School of Electronics & Information Engineering, 41 pages (Oct. 26, 2004).
Karn, P., *Re: [amsat-bb] AO-40 Satellite RF Architecture Question*, at http://www.uk/amsat.org/ListArchives/amsat-bb/2002/msg01409.html, 2 pages (Feb. 25, 2002).
Katz, A., *Linearization: Reducing Distortion in Power Amplifiers*, The College of New Jersey, 52 pages (Apr. 16, 2004).
Kaunisto, R., "A Vector-Locked Loop for Power Amplifier Linearization," *IEEE MTT-S International Microwave Symposium Digest*, 4 pages (Jun. 6-11, 2004).
Kelly, W.M. et al., "Vector Modulator, Output Amplifier, and Multiplier Chain Assemblies for a Vector Signal Generator," *Hewlett-Packard Journal*, vol. 38, No. 11, pp. 48-52 (Dec. 1987).
Kenington, P.B. et al., "Broadband Linearisation of High-Efficiency Power Amplifiers," *Proceedings of the Third International Mobile Satellite Conference*, pp. 59-64 (1993).
Kim, I. et al., "The linearity and efficiency enhancement using 3-way Doherty amplifier with uneven power drive," *International Technical Conference on Circuits/Systems, Computers and Communications*, Jeju, Korea, pp. 369-370 (Jul. 2005).
Kim, J. et al., "Optimum Operation of Asymmetrical-Cells-Based Linear Doherty Power Amplifiers—Uneven Power Drive and Power Matching," *IEEE Transactions on Microwave Theory and Techniques*, vol. 53, No. 5, pp. 1802-1809 (May 2005).
Kosugi, H. et al., "A High-Efficiency Linear Power Amplifier Using an Envelope Feedback Method," *Electronics and Communications in Japan*, Part 2, vol. 77, No. 3, pp. 50-57 (1994).
Kurzrok, R., "Simple Lab-Built Test Accessories for RF, IF, Baseband and Audio," *High Frequency Electronics*, pp. 60 and 62-64 (May 2003).
Langridge, R. et al., "A Power Re-Use Technique for Improved Efficiency of Outphasing Microwave Power Amplifiers," *IEEE Transactions on Microwave Theory and Techniques*, vol. 47, No. 8, pp. 1467-1470 (Aug. 1999).
Li, C. et al., "Optimal IDM-MISO Transmit Strategy with Partial CSI at Transmitter," 6 pages, downloaded Jun. 2006 from http://www.288.pair.com/ciss/ciss/numbered/36.pdf.
Love, D.J. et al., "Grassmannian Beamforming for Multiple-Input Multiple-Output Wireless Systems," pp. 1-29, downloaded Jun. 2006 from http://www.math.ucdavis.edu/~strohmer/papers/2003/grassbeam.ps.gz, Jun. 3, 2003.
Lyles, J.T.M., *[Amps] Amplifuzz [TSPA]*, at http://lists.contesting.com/pipermail/amps/2005-January/042303.html, 2 pages (Jan. 28, 2005).
*Manuals and Schematics*, at http://www.lks.net/~radio/Pages/manuals.htm, 8 pages (last update Aug. 23, 2005).
Masse, D., "Advanced Techniques in RF Power Amplifier Design," *Microwave Journal (International Edition)*, vol. 45, Issue 9, p. 216 (Sep. 2002).
Masse, D., "Design of Linear RF Outphasing Power Amplifiers," *Microwave Journal (International Edition)*, vol. 47, Issue 7, p. 152 (Jul. 2004).
McCune, E., "High-Efficiency, Multi-Mode Multi-Band Terminal Power Amplifiers," *IEEE Microwave Magazine*, vol. 6, No. 1, pp. 44-55 (Mar. 2005).
McPherson, D.S. et al., "A 28 GHz HBT Vector Modulator and Its Application to an LMCS Feedforward Power Amplifier," *28th European Microwave Conference—Amsterdam*, vol. 1, pp. 523-528 (1998).
*Mead Education: Information Registration: RF Transceivers and Power Amplifiers*, at http://www.mead.ch/htm/ch/bios_texte/RF-PA_05_text.html, 3 pages (printed Sep. 1, 2005).
Morais, D.H. and Feher, K., "NLA-QAM: A Method for Generating High-Power QAM Signals Through Nonlinear Amplification," *IEEE Transactions on Communications*, vol. COM-30, No. 3, pp. 517-522 (Mar. 1982).
Moustakas, A.L. and Simon, S.H., "Optimizing multiple-input single-output (MISO) communication systems with general Gaussian channels; nontrivial covariance and nonzero mean," *IEEE Trans. on Information Theory*, vol. 49, Issue 10, pp. 2770-2780, Oct. 2003.
Musson, D.R., "Ampliphase . . . for Economical Super-Power AM Transmitters", *Broadcast News*, vol. No. 119, pp. 24-29 (Feb. 1964).
Norris, G.B. et al., "A Fully Monolithic 4-18 GHZ Digital Vector Modulator," *IEEE MTT-S International Microwave Symposium Diges*, pp. 789-792 (1990).
Olson, S.A. and Stengel, R.E., "LINC Imbalance Correction using Baseband Preconditioning," *Proceedings IEEE Radio Wireless Conference*, pp. 179-182 (Aug. 1-4, 1999).
Pereyra, L. A., "Modulation techniques for radiodiffusion transmitters," *Revista Telegrafica Electronica*, vol. 67, No. 801, pp. 1132-1138 and 1148 (Oct. 1979).
Pigeon, M., "A CBC Engineering Report: Montreal Antenna Replacement Project," *Broadcast Technology*, vol. 15, No. 4, pp. 25-27 (Jan. 1990).
Poitau, G. et al., "Experimental Characterization of LINC Outphasing Combiners' Efficiency and Linearity," *Proceedings IEEE Radio and Wireless Conference*, pp. 87-90 (2004).
Price, T.H., "The Circuit Development of the Ampliphase Broadcasting Transmitter," *The Proceedings of the Institution of Electrical Engineers*, vol. 101, pp. 391-399 (1954).
Qiu, R.C. et al., "Time Reversal with MISO for Ultra-Wideband Communications: Experimental Results (*invited paper*)," 4 pages, downloaded Jun. 2006 from http://iweb.tntech.edu/rqiu/paper/conference/RWS06Qiu_TH2B1.pdf.
Raab, F.H. et al., "Power Amplifiers and Transmitters for RF and Microwave," *IEEE Transactions on Microwave Theory and Techniques*, vol. 50, No. 3, pp. 814-826 (Mar. 2002).
Raab, F.H. et al., "RF and Microwave Power Amplifier and Transmitter Technologies—Part 1," *High Frequency Electronics*, pp. 22, 24, 26, 28, 29, 30, 32, 34, and 36 (May 2003).
Raab, F.H. et al., "RF and Microwave Power Amplifier and Transmitter Technologies—Part 3," *High Frequency Electronics*, pp. 34, 36, 38, 40, 42-44, 46, and 48 (2003).
Raab, F.H. et al., "RF and Microwave Power Amplifier and Transmitter Technologies—Part 5," *High Frequency Electronics*, pp. 46, 48-50, 52, and 54 (2004).
Raab, F.H., "Efficiency of Doherty RF-Power Amplifier Systems," *IEEE Transactions on Broadcasting*, vol. BC-33, No. 3, pp. 77-83 (Sep. 1987).
Raab, F.H., "Efficiency of Outphasing RF Power-Amplifier Systems," *IEEE Transactions on Communications*, vol. COM-33, No. 10, pp. 1094-1099 (Oct. 1985).
Rabjohn, G. and Wight, J., "Improving Efficiency, Output Power with 802.11a Out-Phasing PAs," at http://www.us.design.reuse.com/articles/article6937.html, 8 pages (Jan. 9, 2004).
Rustako, A.J. and Yeh, Y.S., "A Wide-Band Phase-Feedback Inverse-Sine Phase Modulator with Application Toward a LINC

(56) References Cited

OTHER PUBLICATIONS

Amplifier," *IEEE Transactions on Communications*, vol. COM-24, No. 10, pp. 1139-1143 (Oct. 1976).
Saleh, A.A.M. and Cox, D.C., "Improving the Power-Added Efficiency of FET Amplifiers Operating with Varying-Envelope Signals," *IEEE Transactions on Microwave Theory and Techniques*, vol. 31, No. 1, pp. 51-56 (Jan. 1983).
Saraga, W., "A new version of the out-phasing (quadrature-modulation) method for frequency translation (SSB generation and detection)," *Transmission Aspects of Communications Networks*, pp. 131-134 (1964).
Shi, B. and Sundström, L., "A 200-MHz IF BiCMOS Signal Component Separator for Linear LINC Transmitters," *IEEE Journal of Solid-State Circuits*, vol. 35, No. 7, pp. 987-993 (Jul. 2000).
Shi, B. and Sundström, L., "A Voltage-Translinear Based CMOS Signal Component Separator Chip for Linear LINC Transmitters," *Analog Integrated Circuits and Signal Processing*, 30, pp. 31-39 (2002).
Shi, B. and Sundström, L., "Investigation of a Highly Efficient LINC Amplifier Topology," *Proceedings IEEE 45th Vehicular Technology Conference*, vol. 2, pp. 1215-1219 (Oct. 7-11, 2001).
Shin, B. et al., "Linear Power Amplifier based on 3-Way Doherty Amplifier with Predistorter," *IEEE MTT-S International Microwave Symposium Digest*, pp. 2027-2030 (2004).
Simon, M. and Weigel, R., "A Low Noise Vector Modulator with integrated Basebandfilter in 120 nm CMOS Technology," *2003 IEEE Radio Frequency Integrated Circuits Symposium*, pp. 409-412 (2003).
Skarbek, I. "New High-Efficiency 5-KW AM Transmitter 'Unique Class C Amplifier Operates with 90% Efficiency'," *RCE Broadcast News # 107*, pp. 8-13 (Mar. 1960).
Sokal, N. O., "RF Power Amplifiers, Classes A though S—How they Operate, and When to Use Each," *Electronics Industries Forum of New England, Professional Program Proceedings*, Boston, MA, pp. 179-252 (1997).
Staudinger, J. et al, "High Efficiency CDMA RF Power Amplifier Using Dynamic Envelope Tracking Technique," *IEEE MTT-S International Microwave Symposium Digest*, vol. 2, pp. 873-876 (Jun. 11-16, 2000).
Stengel, B. and Eisenstadt, W.R., "LINC Power Amplifier Combiner Method Efficiency Optimization," *IEEE Transactions on Vehicular Technology*, vol. 49, No. 1, pp. 229-234 (Jan. 2000).
Sundström, L. "Spectral Sensitivity of LINC Transmitters to Quadrature Modulator Misalignments," *IEEE Transactions on Vehicular Technology*, vol. 49, No. 4, pp. 1474-1487 (Jul. 2000).
Sundström, L., "Automatic adjustment of gain and phase imbalances in LINC transmitters," *Electronics Letters*, vol. 31, No. 3, pp. 155-156 (Feb. 2, 1995).
Sundström, L., "Effect of modulation scheme on LINC transmitter power efficiency," *Electronics Letters*, vol. 30, No. 20, pp. 1643-1645 (Sep. 29, 1994).
Sundström, L., "Effects of reconstruction filters and sampling rate for a digital signal component separator on LINC transmitter performance," *Electronics Letters*, vol. 31, No. 14, pp. 1124-1125 (Jul. 6, 1995).
Sundström, L., "The Effect of Quantization in a Digital Signal Component Separator for LINC Transmitters," *IEEE Transactions on Vehicular Technology*, vol. 45, No. 2, pp. 346-352 (May 1996).
Sundström, L., *Digital RF Power Amplifier Linearisers Analysis and Design*, Department of Applied Electronics, Lund University, pp. i-x and 1-64 (1995).
Tan, J. S. and Gardner, P., "A LINC Demonstrator Based on Switchable Phase Shifters," *Microwave and Optical Technology Letters*, vol. 35, No. 4, pp. 262-264 (Nov. 20, 2002).
Tchamov, N. T., *Power Amplifiers*, Tampere University of Technology, Institute of Communications Engineering, RF-ASIC Laboratory, 26 pages (May 17, 2004).
*TDP: RCS BHF-100A*, at http://www.transmitter.be/rca-bhf100a.html, 8 pages (printed Jun. 15, 2005).

*The Ampliphase Ancestry*, at http://www.rossrevenge.co.uk/tx/ancest.htm, 8 pages, (latest update Aug. 2002).
Tomisato, S. et al., "Phase Error Free LINC Modulator," *Electronics Letters*, vol. 25, No. 9, pp. 576-577 (Apr. 27, 1989).
Ullah, I., "Exciter Modulator for an Ampliphase Type Broadcast Transmitter," *ABU Technical Review*, No. 62, pp. 21-27 (May 1979).
Ullah, I., "Output Circuit of an Ampliphase Broadcast Transmitter," *ABU Technical Review*, No. 63, pp. 17-24 (Jul. 1979).
Vasyukov, V.V. et al., "The Effect of Channel Phase Asymmetry on Nonlinear Distortions in Modulation by Dephasing," *Radioelectronics and Communications Systems*, vol. 28, No. 4, pp. 86-87 (1985).
Venkataramani, M., *Efficiency Improvement of WCDMA Base Station Transmitters using Class-F power amplifiers*, Thesis, Virginia Polytechnic Institute, Blacksburg, Virginia, pp. i-xi and 155 (Feb. 13, 2004).
Virmani, B.D., "Phase-to-amplitude modulation," *Wireless World*, vol. 61, No. 4, pp. 183-187 (Apr. 1955).
Wang, F. et al., "Envelope Tracking Power Amplifier with Pre-Distortion Linearization for WLAN 802.11g," *2004 IEEE MTT-S International Microwave Symposium Digest*, vol. 3, pp. 1543-1546 (Jun. 6-11, 2004).
Whitaker, Jerry C., *Power Vacuum Tubes Handbook* (*Electronics Handbook Series*), CRC Publishing, ISBN No. 0849313457, pp. 236-238 (May 1999).
Wight, J., "Computational microwave circuits arrive," at http://www.eetimes.com/showArticle.jhtml?articleID=18900752, EE Times, 3 pages (Apr. 12, 2004).
Wilds, R.B., "An S-Band Two-Phase Demodulator," pp. 48-53 (Aug. 1958).
Woo, Y.Y. et al., "SDR Transmitter Based on LINC Amplifier with Bias Control," *IEEE MTT-S International Microwave Symposium Digest*, pp. 1703-1706 (2003).
Ya, S. et al., "A C-Band Monolithic Vector Modulator," *Research & Progress of SSE*, vol. 14, No. 4, pp. 302-306 (Nov. 1994).
Yang, Y. et al., "A Fully Matched N-Way Doherty Amplifier With Optimized Linearity," *IEEE Transactions on Microwave Theory and Techniques*, vol. 51, No. 3. pp. 986-993 (Mar. 2003).
Yang, Y. et al., "A Microwave Doherty Amplifier Employing Envelope Tracking Technique for High Efficiency and Linearity," *IEEE Microwave and Wireless Components Letters*, vol. 13, No. 9, pp. 370-372 (Sep. 2003).
Yang, Y. et al., "Experimental Investigation on Efficiency and Linearity of Microwave Doherty Amplifier," IEEE, 4 pages (2001).
Yang, Y. et al., "Optimum Design for Linearity and Efficiency of a Microwave Doherty Amplifier Using a New Load Matching Technique," *Microwave Journal*, 8 pages (Dec. 1, 2001).
Yankin, V. A., "Effect of quantization, amplifier noise and the parameters of the calibration elements on the accuracy of measurement using a six-port microwave ampliphasemeter," *Radioelectronics and Communication Systems*, vol. 32, No. 8, pp. 110-112 (1989).
Yao, J. and Long, S.I., "High Efficiency Switching-Mode Amplifier for Mobile and Base Station Applications," Final Report 2002-03 for MICRO Project 02-044, 4 pages (2002-2003).
Yao, J. et al., "High Efficiency Switch Mode Amplifiers for Mobile and Base Station Applications," Final Report 2000-2001 for MICRO Project 00-061, 4 pages (2000-2001).
Yi, J. et al., "Effect of efficiency optimization on linearity of LINC amplifiers with CDMA signal," *IEEE MTT-S International Microwave Symposium Digest*, vol. 2, pp. 1359-1362 (May 2001).
Zhang, X., *An Improved Outphasing Power Amplifier System for Wireless Communications*, Dissertation, University of California, San Diego, pp. i-xvii and 1-201 (2001).
Zhang, X. and Larson, L.E., "Gain and Phase Error-Free LINC Transmitter," *IEEE Transactions on Vehicular Technology*, vol. 49, No. 5, pp. 1986-1994 (Sep. 2000).
Zhang, X. et al. "Gain/Phase Imbalance-Minimization Techniques for LINC Transmitters," *IEEE Transactions on Microwave Theory and Techniques*, vol. 49, No. 12, pp. 2507-2516 (Dec. 2001).
Zhang, X. et al., "A Gain/Phase Imbalance Minimization Technique for LINC Transmitter," *IEEE MTT-S International Microwave Symposium Digest*, pp. 801-804 (2001).

(56) References Cited

OTHER PUBLICATIONS

Zhang, X. et al., "Analysis of Power Recycling Techniques for RF and Microwave Outphasing Power Amplifiers," *IEEE Transactions on Circuits and Systems II: Analog and Digital Signal Processing*, vol. 49, No. 5, p. 312-320 (May 2002).
Zhang, X. et al., "Calibration scheme for LINC transmitter," *Electronics Letters*, vol. 37, No. 5, pp. 317-318 (Mar. 1, 2001).
Zhang, X. et al., *Design of Linear RF Outphasing Power Amplifiers*, entire book, Artech House, ISBN No. 1-58053-374-4 (2003).
Zhong, S.S. and Cui, J.H., "A New Dual Polarized Aperture-Coupled Printer Array for SAR Applications," *Journal of Shanghai University (English Edition)*, vol. 5, No. 4, pp. 295-298 (Dec. 2001).
English Abstract for European Patent Publication No. EP 0 639 307 B1, published Feb. 22, 1995, downloaded from http://v3.espacenet.com, 1 page.
English Abstract for European Patent Publication No. EP 0 708 546 A2, published Apr. 24, 1996, downloaded from http://v3.espacenet.com, 1 page.
English Abstract for European Patent Publication No. EP 0 892 529 A2, published Jan. 20, 1999, downloaded from http://v3.espacenet.com, 1 page.
English Abstract for Japanese Patent Publication No. JP 60-63517 A, published Apr. 11, 1985, downloaded from http://v3.espacenet.com, 1 page.
English Abstract for Japanese Patent Publication No. JP 2-87708 A, published Feb. 28, 1990, downloaded from http://v3.espacenet.com, 1 page.
English Abstract for Japanese Patent Publication No. JP 3-232307 A, published Oct. 16, 1991, downloaded from http://v3.espacenet.com, 1 page.
English Abstract for Japanese Patent Publication No. JP 5-22046 A, published Jan. 29, 1993, downloaded from http://v3.espacenet.com, 1 page.
English Abstract for Japanese Patent Publication No. JP 6-338728 A, published Dec. 6, 1994, downloaded from http://v3.espacenet.com, 1 page.
English Abstract for Japanese Patent Publication No. JP 10-70451 A, published Mar. 19, 1998, downloaded from http://v3.espacenet.com, 1 page.
English Abstract for Japanese Patent Publication No. JP 2001-136057 A, published May 18, 2001, downloaded from http://v3.espacenet.com, 1 page.
English Abstract for Japanese Patent Publication No. JP 2004-260707 A, published Sep. 16, 2004, downloaded from http://v3.espacenet.com, 1 page.
English Translation for Romanian Patent Publication No. RO 100466, published Aug. 20, 1992, obtained from Transperfect Translations, 4 pages.
English Abstract for Romanian Patent Publication No. RO 102824, published Nov. 19, 2001, downloaded from http://v3.espacenet.com, 1 page.
English Translation for Russian Patent Publication No. SU 1322183 A1, published Jul. 7, 1987, obtained from Transperfect Translations, 2 pages.
Notification of Transmittal of the International Search Report and Written Opinion, dated Mar. 4, 2008, for PCT Application No. PCT/US07/06197, 8 pages.
Notification of Transmittal of the International Search Report and Written Opinion, dated Aug. 15, 2008, for PCT Application No. PCT/US08/06360, 6 pages.
Notification of Transmittal of the International Search Report and Written Opinion, dated Sep. 3, 2008, for PCT Application No. PCT/US2008/008118, 6 pages.
Notification of Transmittal of the International Search Report and Written Opinion, dated Sep. 8, 2008, for PCT Application No. PCT/US2008/007623, 6 pages.
Silverman, L. and Del Plato, C., "Vector Modulator Enhances Feedforward Cancellation," *Microwaves & RF*, pp. 1-4 (Mar. 1998).
Notification of Transmittal of the International Search Report and Written Opinion, dated Jul. 7, 2009, for PCT Application No. PCT/US09/03212, 6 pages.
Jang, M. et al., "Linearity Improvement of Power Amplifier Using Modulation of Low Frequency IMD Signals," *Asia-Pacific Microwave Conference Proceedings*, vol. 2, pp. 1156-1159, Dec. 4-7, 2005.
Woo, W. et al., "A Hybrid Digital/RF Envelope Predistortion Linearization System for Power Amplifiers," *IEEE Transactions on Microwave Theory and Techniques*, vol. 53, No. 1, pp. 229-237, Jan. 2005.
Notification of Transmittal of the International Search Report and Written Opinion, dated Apr. 27, 2010, for PCT Application No. PCT/US2009/057306, 11 pages.
English Abstract for Japanese Patent Publication No. JP 2005-151543 A, published Jun. 9, 2005, downloaded from http://v3.espacenet.com, 1 page.
English Abstract for Japanese Patent Publication No. JP 1-284106 A, published Nov. 15, 1989, downloaded from http://v3.espacenet.com, 1 page.
English Abstract for Japanese Patent Publication No. JP 4-095409 A, published Mar. 27, 1992, downloaded from http://v3.espacenet.com, 1 page.
English Abstract for Japanese Patent Publication No. JP 4-104604 A, published Apr. 7, 1992, downloaded from http://v3.espacenet.com, 1 page.
English Abstract for Japanese Patent Publication No. JP 9-018536 A, published Jan. 17, 1997, downloaded from http://v3.espacenet.com, 1 page.
English Abstract for Japanese Patent Publication No. JP 9-074320 A, published Mar. 18, 1997, downloaded from http://v3.espacenet.com, 1 page.
English Abstract for Japanese Patent Publication No. JP 2000-209291 A, published Jul. 28, 2000, downloaded from http://v3.espacenet.com, 1 page.
English Abstract for Japanese Patent Publication No. JP 2003-298357 A, published Oct. 17, 2003, downloaded from http://v3.espacenet.com, 1 page.
English Abstract for Japanese Patent Publication No. JP 2000-244261 A, published Sep. 8, 2000, downloaded from http://worldwide.espacenet.com, 1 page.
English Abstract for Japanese Patent Publication No. JP 2001-217659 A, published Aug. 10, 2001, downloaded from http://worldwide.espacenet.com, 1 page.
English Abstract for Japanese Patent Publication No. JP 2001-308650 A, published Nov. 2, 2001, downloaded from http://worldwide.espacenet.com, 1 page.
English Abstract for Japanese Patent Publication No. JP 2002-543729 A, published Dec. 17, 2002, downloaded from http://worldwide.espacenet.com, 1 page.
English Abstract for Japanese Patent Publication No. JP 5-037263 A, published Feb. 12, 1993, downloaded from http://worldwide.espacenet.com, 1 page.
English Abstract for Japanese Patent Publication No. JP 2005-101940 A, published Apr. 14, 2005, downloaded from http://worldwide.espacenet.com, 1 page.
Notification of Transmittal of the International Search Report and Written Opinion, dated Aug. 14, 2012, for PCT Appl. No. PCT/US2012/032791, 7 pages.
Harlan, G. et al, "Dynamically-Configurable Multimode Transmitter Systems for Wireless Handsets, Cognitive Radio and SDR Applications," *IEEE International Conference on Microwaves, Communications, Antennas and Electronics Systems*, Nov. 9, 2009, pp. 1-5.
Rawlins, G. and Sorrells, D., "A Thermodynamic Theory of RF Power Transmitters with an Example," *IEEE 10th Annual Wireless and Microwave Technology Conference*, Apr. 20, 2009, pp. 1-5.
Rawlins, G. et al., "Using an IQ Data to RF Power Transmitter to Realize a Highly-Efficient Transmit Chain for Current and Next-Generation Mobile Handsets," *Proceedings of the 38th European Microwave Conference*, Oct. 27, 2008, pp. 579-582.

(56) References Cited

OTHER PUBLICATIONS

Notification of Transmittal of the International Search Report and Written Opinion, dated Dec. 14, 2012, for PCT Appl. No. PCT/US2012/040500, 9 pages.
English Abstract for Japanese Patent Publication No. JP H08-163189 A, published Jun. 21, 1996, downloaded from http://worldwide.espacenet.com, 2 pages.
English Abstract for Japanese Patent Publication No. JP 2003-298361 A, published Oct. 17, 2003, downloaded from http://worldwide.espacenet.com, 2 pages.
English Abstract for Japanese Patent Publication No. JP 3-276923 A, published Dec. 9, 1991, downloaded from http://worldwide.espacenet.com, 2 pages.
Notification of Transmittal of the International Search Report and Written Opinion, dated Dec. 31, 2014, for PCT Appl. No. PCT/US2014/056086, 18 pages.
English Abstract for Japanese Patent Publication No. JP 3-247101 A, published Nov. 5, 1991, downloaded from http://worldwide.espacenet.com, 2 pages.

\* cited by examiner

SYSTEMS AND METHODS OF RF POWER TRANSMISSION, MODULATION, AND AMPLIFICATION

CROSS REFERENCE TO RELATED APPLICATIONS

This application is a continuation of pending U.S. patent application Ser. No. 14/541,201, filed Nov. 14, 2014, titled "Systems and Methods of RF Power Transmission, Modulation, and Amplification," which is a continuation of U.S. patent application Ser. No. 13/442,706, filed Apr. 9, 2012, titled "Systems and Methods of RF Power Transmission, Modulation, and Amplification," which claims the benefit of U.S. Provisional Patent Application No. 61/457,487, filed Apr. 8, 2011, titled "Systems and Methods of RF Power Transmission, Modulation, and Amplification," all of which are incorporated herein by reference in their entireties.

This application is related to U.S. patent application Ser. No. 11/256,172, filed Oct. 24, 2005, now U.S. Pat. No. 7,184,723, U.S. patent application Ser. No. 11/508,989, filed Aug. 24, 2006, now U.S. Pat. No. 7,355,470, and U.S. patent application Ser. No. 12/236,079, filed Sep. 23, 2008, now U.S. Pat. No. 7,911,272, all of which are incorporated by reference in their entireties.

BACKGROUND

Field

Embodiments of the present invention generally relate to systems and methods of RF power transmission, modulation, and amplification. More particular, embodiments of the present invention relate to energy conversion from an AC or DC power source to a modulated RF carrier signal.

Background

A switched non-linear power supply is an electronic power supply that transfers power from a power source (e.g., AC or DC power source) to a load, while converting voltage and current characteristics. An advantage of switched power supplies, among others, over linear power supplies is power efficiency. Other advantages of switched power supplies over linear power supplies are their smaller size, lighter weight, and lower heat generation (due to their higher power efficiency). Typically, switched or non-linear power supplies are used as DC-to-DC or AC-to-DC converters for the purpose of generating a specific DC voltage.

SUMMARY

Embodiments of the present invention utilize elements of switching or non-linear power supply architectures and design techniques to generate a modulated RF carrier signal.

An embodiment of the present invention includes an apparatus for energy conversion. The apparatus can include the following: a trans-impedance node; a reactive element configured to transfer energy to the trans-impedance node; and, a trans-impedance circuit configured to receive one or more control signals and to dynamically adjust an impedance of the trans-impedance node, where the trans-impedance node generates an RF signal based on the one or more control signals. The reactive element can be an inductor, where the inductor can store and transfer energy from an AC or a DC power source to the trans-impedance node. The trans-impedance circuit can include a multiple input/single output (MISO) operator. The MISO operator can be configured to reduce power flow into the trans-impedance node towards the MISO operator and to increase power flow towards an output. Further, the trans-impedance circuit can be configured to generate a plurality of variable dynamic load lines at the trans-impedance node based on the one or more control signals.

Another embodiment of the present invention includes a system for energy conversion. The system can include a power source, an energy converter, a matching network, and an antenna. The energy converter can include the following: a trans-impedance node; a reactive element configured to transfer energy from the power source to the trans-impedance node; and, a trans-impedance circuit configured to receive one or more control signals and to dynamically adjust an impedance of the trans-impedance node, where the trans-impedance node generates an RF signal based on the one or more control signals. Further, the energy converter can be fabricated on a separate chip from the power source, matching network, and antenna.

A further embodiment of the present invention includes a method for energy conversion. The method can include the following: transferring energy from a reactive element to a trans-impedance node; receiving, at a trans-impedance circuit, one or more control signals; and, dynamically adjusting, with the trans-impedance circuit, an impedance of the trans-impedance node, where the trans-impedance node generates an RF signal based on the one or more control signals. The transferring step can include transferring energy from an AC or a DC power source to the trans-impedance node. The dynamically adjusting step can include reducing power flow into the trans-impedance node towards a multiple input/single output (MISO) operator and increasing power flow towards an output away from the MISO operator. Further, the dynamically adjusting step can include generating a plurality of variable dynamic load lines at the trans-impedance node based on the one or more control signals.

Further features and advantages of the invention, as well as the structure and operation of various embodiments of the present invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art based on the teachings contained herein.

BRIEF DESCRIPTION OF THE DRAWINGS

The accompanying drawings, which are incorporated herein and form a part of the specification, illustrate embodiments of the present invention and, together with the description, further serve to explain the principles of the invention and to enable a person skilled in the relevant art to make and use the invention.

DETAILED DESCRIPTION

Figure 1:
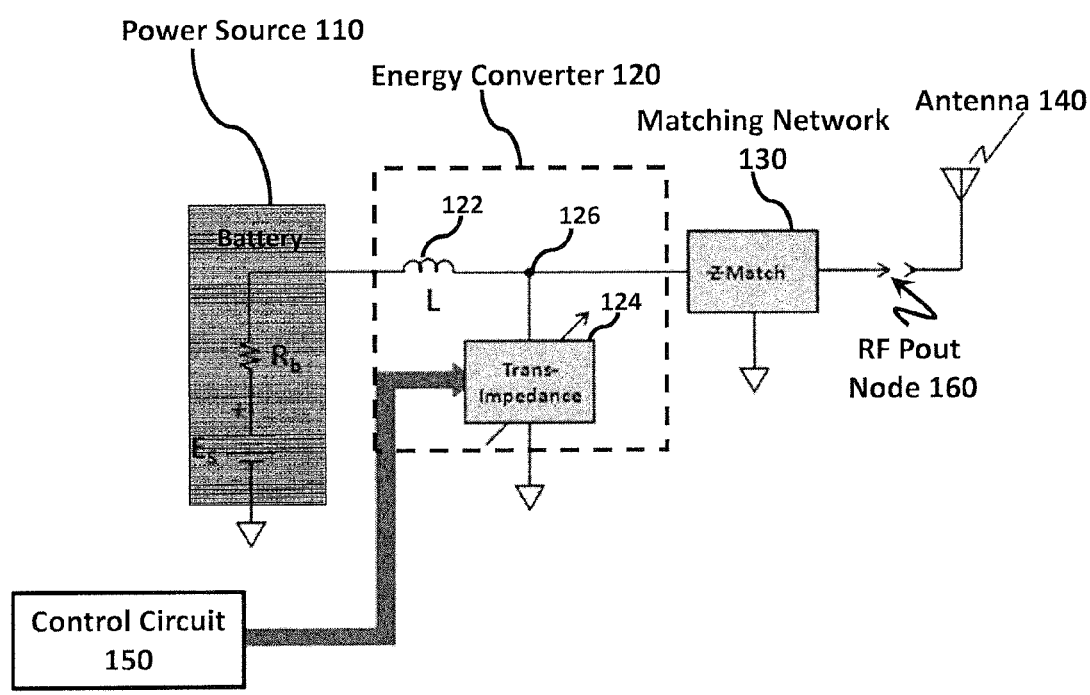
FIG. 1 is an illustration of an embodiment of an energy conversion system.

The following detailed description refers to the accompanying drawings that illustrate exemplary embodiments consistent with this invention. Other embodiments are possible, and modifications can be made to the embodiments within the spirit and scope of the invention. Therefore, the detailed description is not meant to limit the scope of the invention. Rather, the scope of the invention is defined by the appended claims.

It would be apparent to a person skilled in the relevant art that the present invention, as described below, can be implemented in many different embodiments of software, hardware, firmware, and/or the entities illustrated in the figures. Thus, the operational behavior of embodiments of the present invention will be described with the understanding that modifications and variations of the embodiments are possible, given the level of detail presented herein.

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

An energy converter can convert electrical energy of one type to electrical energy of another type. The statistics of an input potential energy to the energy converter can be different from the statistics of output energy from the energy converter. For example, the conversion of one statistic at an input of the energy converter to a different statistic at an output of the energy converter can be subject to information entropy (which can be modulated onto an output waveform) and the nature of the energy conversion apparatus at the input. With this definition of an energy converter, which is used throughout the specification, any form of electrical energy (e.g., AC or DC energy) can be consumed at the input of the energy converter and modulated to produce a desired modulated RF carrier at the output of the energy converter. Therefore, the term "energy converter" has a specific meaning as used in the description below.

The above definition of "energy converter" contrasts characteristics of a traditional amplifier. For example, as would be understood by a person skilled in the relevant art, a traditional amplifier is not designed to accept an input that possesses an arbitrary statistic with respect to an output of the amplifier. Rather, amplifiers are typically designed to reproduce the essential statistic of the input at its output with additional power increase due to a power supply of the amplifier that is consumed during the amplification process.

Further, for typical amplifier designs, the input to the amplifier must possess a carrier frequency consistent with the output of the amplifier and the cross-correlation of the input and output should be as close to 1 as possible or meet minimum output waveform requirements of the amplifier. For example, a traditional amplifier requires a modulated RF carrier signal to be coupled to its input and an amplified version of the input modulated RF carrier signal at the output. This requirement is in addition to accounting for noise and non-linearities in the amplifier design.

FIG. 1 is an illustration of an embodiment of an energy conversion system 100. Energy conversion system 100 is configured to convert electrical energy from a power source (e.g., AC or DC power source) into a modulated RF carrier signal. In an embodiment, energy conversion system 100 can reproduce baseband I/Q data (from control circuit 150) as RF amplitude, frequency, phase modulation at an RF Pout node 160. A benefit of energy conversion system 100, among others, is that the conversion system minimizes energy lost (entropy) in converting energy from power source 110 to the modulated RF carrier signal at RF Pout node 160, as a person skilled in the relevant art will recognize based on the description herein.

Energy conversion system 100 includes a power source 110, an energy converter 120, a matching network 130, an antenna 140, and a control circuit 150. For exemplary purposes, power source 110 is depicted as a DC power source (e.g., a battery). However, based on the description herein, a person skilled in the relevant art will recognize that power source 110 can be other types of power sources such as, for example and without limitation, an AC power source. These other types of power sources are within the spirit and scope of the embodiments described herein.

In an embodiment, power source 110, energy converter 120, matching network 130, antenna 140, control circuit 150, or a combination thereof can be integrated on the same chip (e.g., system on a chip). In another embodiment, energy converter 120 can be integrated on a single chip, receive an energy input from external power source 110, receive one or more control signals from external control circuit 150, and deliver an output signal to external matching network 130. For example, energy converter 120 can be fabricated on a monolithic silicon die (e.g., SiGe).

Matching network 130 is configured to provide an impedance path between energy converter 120 and RF Pout node 160 to maximize power transfer and/or minimize reflections from RF Pout node 160. In an embodiment, matching network 130 includes a DC block, an RF filter, and an RF load (not shown in FIG. 1). Antenna 140 is configured to transmit the modulated RF carrier signal. Matching circuits and antennas are well known to a person skilled in the relevant art.

Energy converter 120 includes a reactive element 122 and a trans-impedance circuit 124. Reactive element 122 can be an inductor L according to an embodiment of the present invention. Trans-impedance circuit 124 receives one or more control signals from control circuit 150. In an embodiment, the one or more control signals (also referred to herein as "an information stream") can be derived from in-phase (I) and quadrature (Q) phase data streams. In another embodiment, the information stream can be translated into serial sigma-delta format with a separate synchronous clock.

In yet another embodiment, algorithms associated with trans-impedance circuit 124 can be non-linear and feed forward, in which the information stream received by trans-impedance circuit 124 can be parsed into two more parallel paths. These two or more parallel paths are also referred to herein as "information control paths." The information stream can be parsed into one or more amplitude information control paths, one or more phase information control paths, one or more frequency information control paths, or a combination thereof, according to an embodiment of the present invention. Each of the information control paths can distribute a portion of the total input information entropy augmented by the non-linear mappings of the algorithms from trans-impedance circuit 124. In an embodiment, the information control paths can be further partitioned into an upper branch circuitry and a lower branch circuitry to accommodate particular technologies and applications.

Based on the description herein, a person skilled in the relevant art will recognize that other types of data streams can provide the information stream to trans-impedance circuit 124. These other types of data streams are within the spirit and scope of the embodiments described herein.

Figure 2:
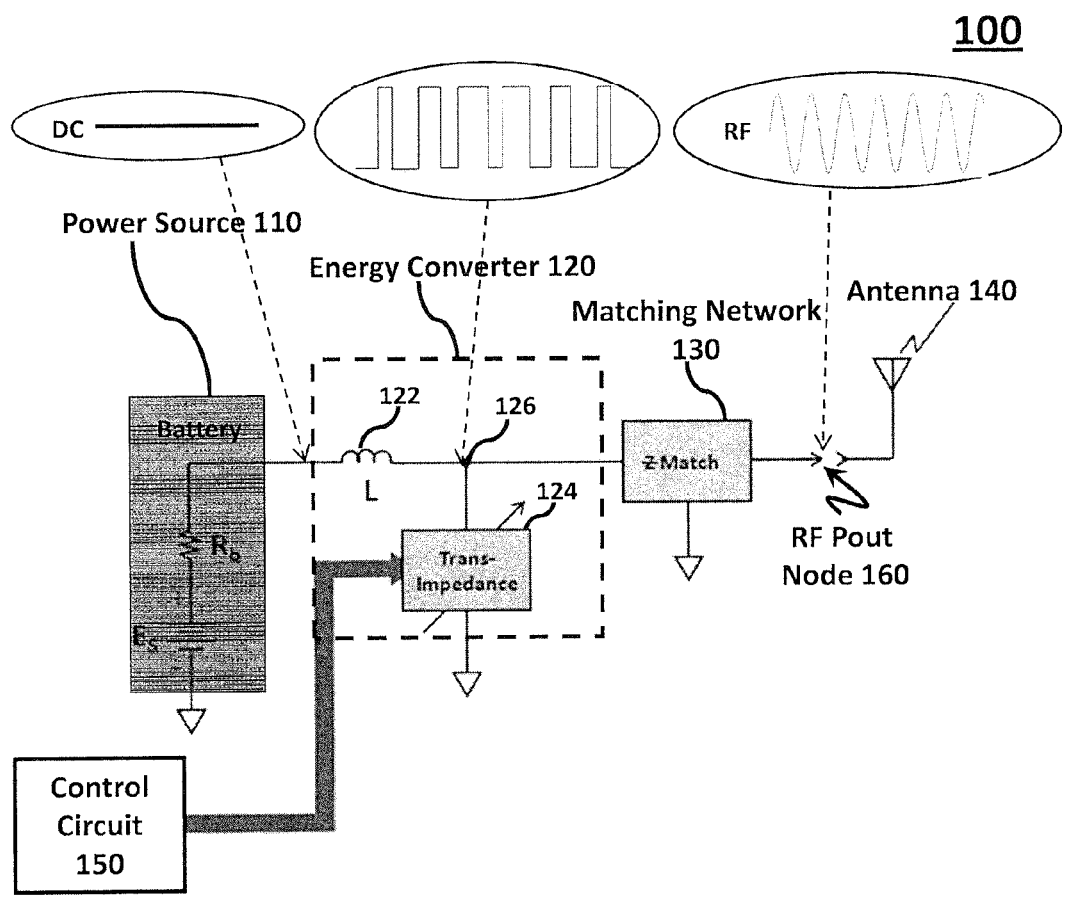
FIG. 2 is an illustration of an energy conversion system with exemplary waveforms associated therewith.

In referring to FIG. 1, in an embodiment, energy converter 120 is configured to transfer energy from power source 110 to an RF carrier by varying the impedance of an RF output to create a trans-impedance node 126 that can directly convert the energy from power source 110. Trans-impedance node 126 generates an RF signal and operates as an RF switching power supply (e.g., DC to RF switching power supply or AC to RF switching power supply), according to an embodiment of the present invention. In turn, trans-impedance node 126 provides an efficient transfer of energy from power supply 110 to an RF carrier at RF Pout node 160. FIG. 2 is an illustration of energy conversion system 100 with exemplary waveforms at an input to energy converter 120 (e.g., DC waveform), trans-impedance node 126, and RF Pout node 160.

Trans-impedance node 126 has a complex impedance that is dynamic in nature and also has a one-to-one correspondence with a modulation complex envelope, according to an embodiment of the present invention. The impedance of trans-impedance node 126 is complex such that phase and magnitude of the modulation complex envelope can be rendered at RF Pout node 160. The real component of the impedance to ground at trans-impedance node 126 is managed to minimize real power loss given a real load. Since the load has at least a partially real component, an optimal conjugate match to trans-impedance circuit 124, reactive element 122, and power supply 110 is obtained through matching network 130 and the effective impedance of trans-impedance node 126 also having a real component. The complex component of the impedance of trans-impedance node 126 does not consume power, but can alter the power conveyed to the load. Likewise, a real component of zero ohms or infinity does not consume power at trans-impedance node 126.

Figure 3:
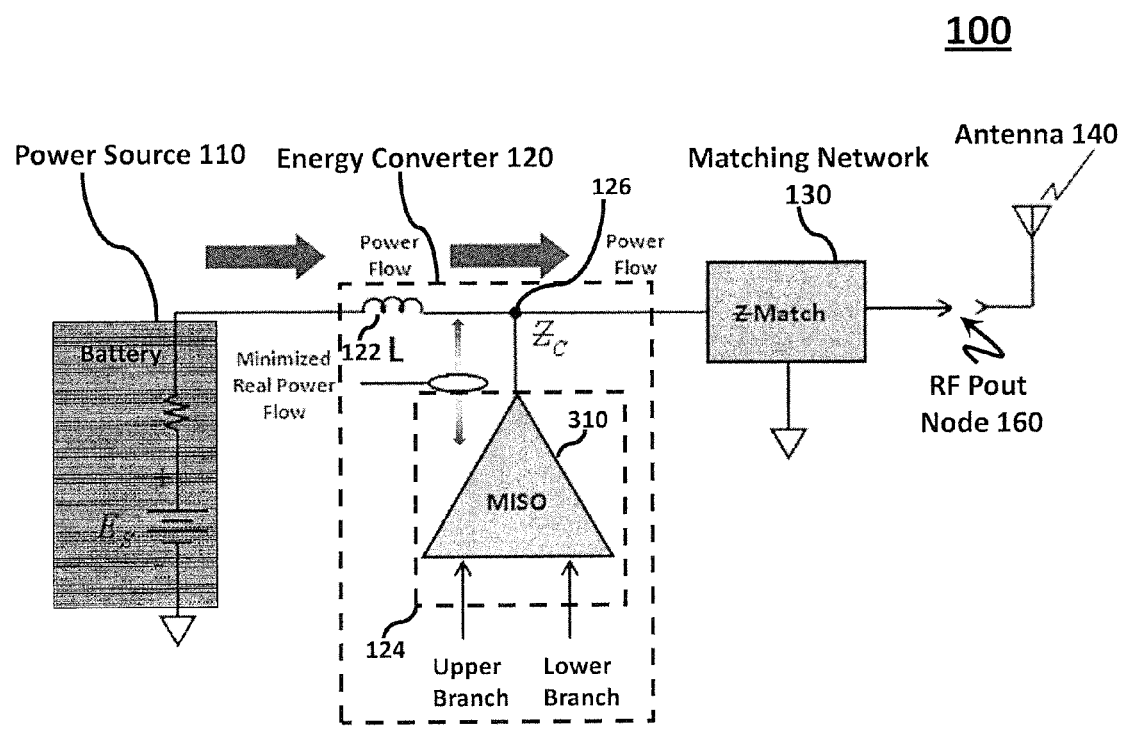
FIG. 3 is an illustration of an embodiment of an energy conversion system with a multiple input/single output (MISO) operator.

FIG. 3 is an illustration of energy conversion system 100 with an embodiment of trans-impedance circuit 124. For simplicity purposes, control circuit 150 is not depicted in FIG. 3. Trans-impedance circuit 124 includes a multiple input/single output (MISO) operator 310, in which MISO operator 310 includes multiple inputs configured to provide one or more functions to control trans-impedance node 126. In an embodiment, the multiple inputs to MISO operator 310 can be information control paths partitioned into an upper branch and a lower branch, as discussed above. The information control paths that serve as inputs to MISO operator 310 can be directly or indirectly utilized by MISO operator 310 to integrate the original information entropy (e.g., provided by control circuit 150) in a form that optimally controls the complex impedance of trans-impedance node 126. Each baseband information input sample to MISO operator 310 can have a corresponding unique complex impedance sample at trans-impedance node 126, according to an embodiment of the present invention. This is because trans-impedance node 126 is at a location in energy converter 120 that corresponds to the culmination of a mathematical operation. Thus, MISO operator 310 can be considered as applying a mathematical "function" or "operation" to the information control paths (e.g., inputs to MISO operator 310) such that the impedance at trans-impedance node 126 can vary.

Exemplary details on the operation of MISO operator 310 and related concepts can be in U.S. Pat. No. 7,184,723 to Sorrells et al., U.S. Pat. No. 7,355,470 to Sorrells et al., and U.S. Pat. No. 7,911,272 to Sorrells et al., all of which are incorporated by reference in their entireties.

In referring to FIG. 3, in an embodiment, RF carrier phase and magnitude envelope are generated from power source 110 (e.g., a AC or DC power source) and energy reactive element 122 of energy converter 120. Energy reactive element 122 interacts with the dynamic nature of trans-impedance node 126. The load at RF Pout node 160 is AC coupled so that an average waveform value generated by the interaction between power supply 110, energy reactive element 122, and trans-impedance node 126 can be blocked while permitting RF currents to flow to the load. In an embodiment, with MISO operator 310, power flow can be minimized into trans-impedance node 360 towards the MISO operator and maximized towards the load. In addition, undesired harmonics and spurious responses can be reduced by matching network 130.

In contrast to the MISO operator implementation of FIG. 3, a traditional amplifier implementation significantly differs in operation. For example, the traditional amplifier would receive an RF input signal at a specific power and frequency, add power from a power source, and increase the power of the RF input signal at the amplifier's output to generate a desired RF output signal. In the case of the traditional amplifier, the input frequency and information content of the complex carrier envelope should not be altered significantly to allow the amplifier to generate the desired RF output signal. Energy converter 120, however, is an apparatus that is configured to convert energy from power source 110 to a dynamic impedance at trans-impedance node 126 through algorithms of MISO operator 310 and control circuit 150 (not shown in FIG. 3), according to an embodiment of the present invention. Using this process, minimal energy flows into MISO operator 310 via trans-impedance node 126 and maximal energy flows to the load. Further, unlike the traditional amplifier, the inputs to MISO operator 310 are not amplified. Rather, the inputs to MISO operator are used to control trans-impedance node 126 to generate a desired RF output signal.

Due to the dynamic nature of trans-impedance node 126, as discussed above, a variable dynamic load line is created by energy converter 120. Before discussing the variable dynamic load line of energy converter 120, the concept of a fixed load line will be discussed in order to highlight the differences between the two types of load lines.

Figure 4:
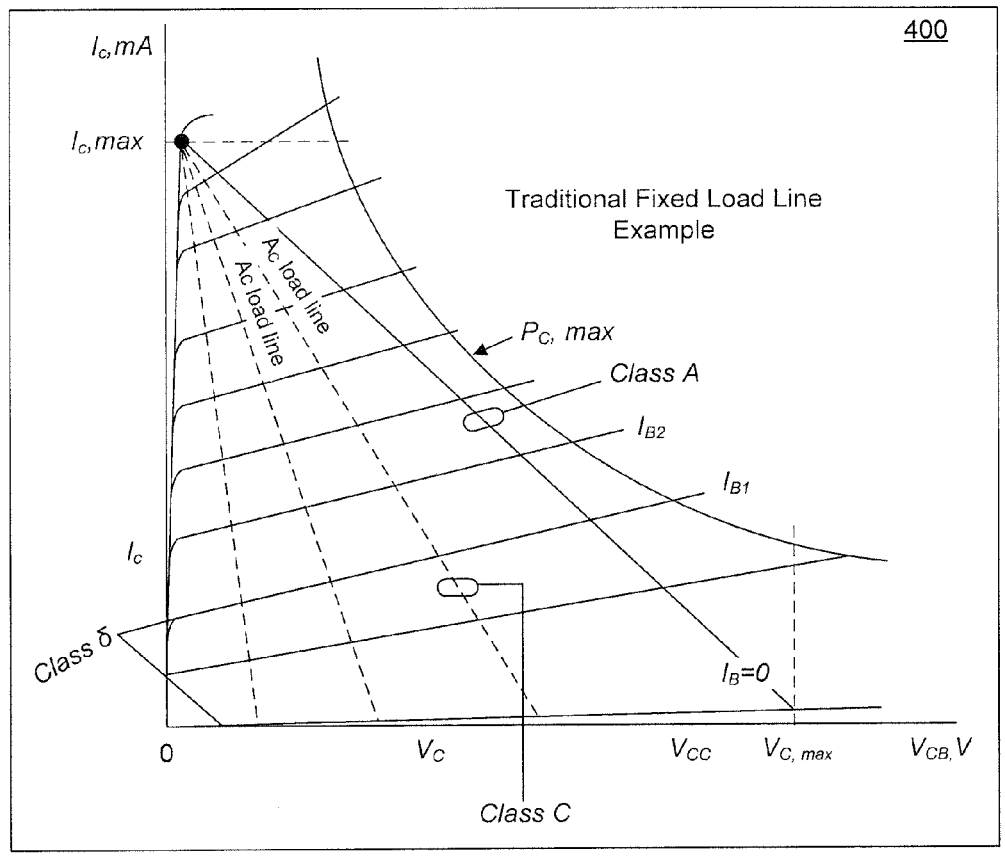
FIG. 4 is an illustration of an exemplary set of fixed load lines for a bipolar junction transistor.

The fixed load line is a specific means for mapping a transfer characteristic for a given input waveform to an amplifier's output waveform. The meaning has universally been applied to various electrical applications such as, for example, vacuum tube and transistor amplifier circuits. In one example, for a bipolar junction transistor (BJT), a load line can relate collector current and collector voltage to the BJT's transfer characteristic through the reflection of a locus of points whose domain is projected or mapped into the collector voltage and current, constrained by the base current of the transistor. That is, variation of the base current corresponds to variation of collector current and voltage, given a particular load, for a common emitter configuration of a BJT amplifier. FIG. 4 is an illustration of an exemplary set of fixed load lines 400 for a BJT, each tailored for varying operational conditions, depicted by defined slopes. As would be understood by a person skilled in the relevant art, field-effect transistors (FETs) as well as BJTs can be characterized in this manner.

In reference to FIG. 4, set of fixed load lines 400 is used when only the input operating bias currents $I_{B_k}$ of the BJT vary. The intersection of the $I_B$ curves and the load line may be reflected horizontally and projected to intersect the vertical or $I_C$ axis. Likewise, the intersection of the $I_B$ curves and the load line may be reflected vertically to project an intersection with the horizontal or $V_C$ axis as well. In this manner, an operating region for the transistor is established for a corresponding variation of $I_B$.

In contrast to set of fixed load lines 400 depicted in FIG. 4, a load line is considered variable and/or dynamic when its slope changes. Different classes of amplifiers are accompanied by different load lines and different static or quiescent operating points along the load line, as would be understood by a person skilled in the relevant art. As discussed above with respect to FIG. 3, MISO operator 310 is not a traditional amplifier. As such, the term "variable dynamic load line" is used herein to highlight the differences between the fixed load lines of the traditional amplifier and the characteristic load lines generated by MISO operator 310. Therefore, based on the description herein, a person skilled in the relevant art will recognize distinctions between the definition for "variable dynamic load line" and traditional or legacy definitions of amplifier load lines.

Figure 5:
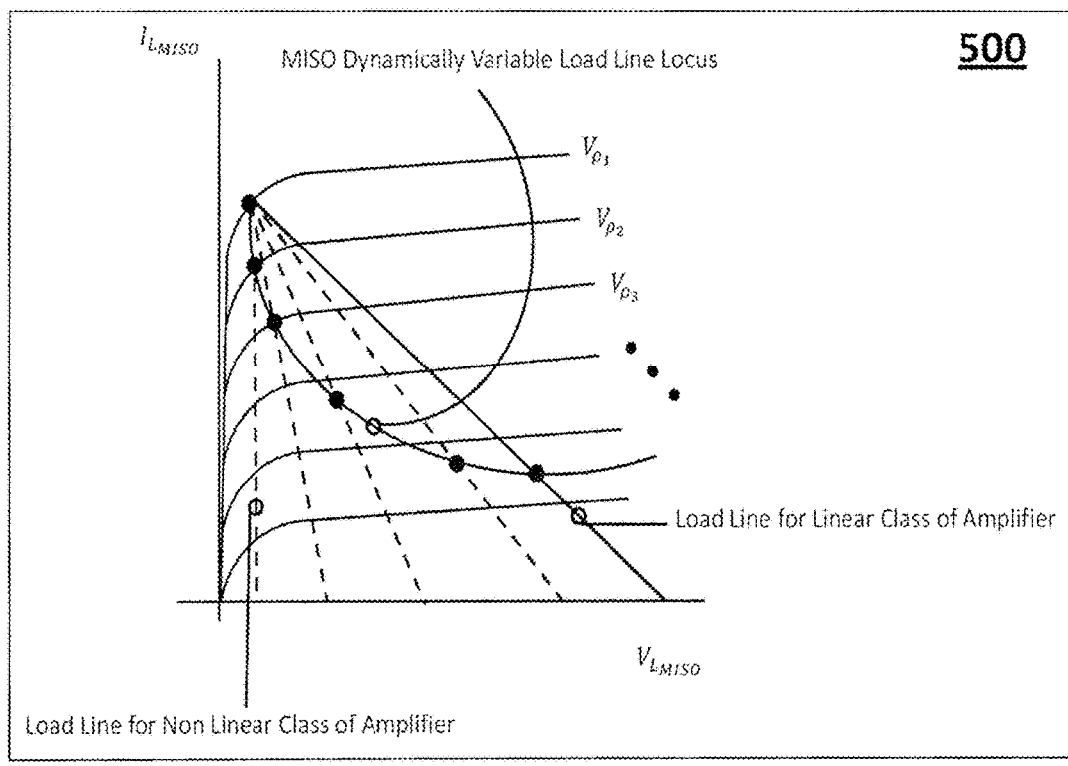
FIG. 5 is an illustration of an exemplary set of variable dynamic load lines generated by a MISO operator, according to an embodiment of the present invention.

FIG. 5 is an illustration of an exemplary set of variable dynamic load lines 500 generated by MISO operator 310 of FIG. 3, according to an embodiment of the present invention. In reference to FIGS. 3 and 5, $I_{L_{MISO}}$ is the current flowing from the power source toward MISO operator 310 and RF Pout node 160. $V_{L_{MISO}}$ is the voltage at trans-impedance node 126 whenever power source 110 and RF Pout node 160 are connected via energy converter 120. $V_{Pk}$ represents a family of curves relating the instantaneous amplitude of the signal to be reproduced to the effective trans-impedance $V_{L_{MISO}}/I_{L_{MISO}}$. In an embodiment, energy converter 120 can be tailored "on the fly" per sample to simultaneously modify the slope as $V_{Pk}$ increases, thus making the load line variable and/or dynamic.

The trajectory or locus of points through this space is illustrated in FIG. 5 for the composite affect. This composite affect produced by MISO operator 310 produces a variable dynamic load line. MISO operator 310 can be programmed to permit any trajectory through this space, according to an embodiment of the present invention. A typical trajectory is illustrated in FIG. 5 for exemplary and explanation purposes and it is not meant to be limiting.

As discussed above, energy converter 120 can vary its load line in real-time. As a result, energy converter 120 can continuously create variable classes of RF amplification—e.g., from linear RF amplification to switch mode RF amplifier classes, as well as hybrid modes. As would be understood by a person skilled in the relevant art, the most linear class is A and there are several classes which are nonlinear such as, for example, classes E, F, and D. Class S by the strictest definition is not an amplifier class; rather, it is a modulator class. However, the attributes of the output stages of a class S modulator are often associated with nonlinear amplification.

The dynamic nature of energy converter 120, as discussed above, introduces an apparatus that can operate over a continuum of classes, as energy converter 120 permits a continuum of points along a continuum of load lines. At any instant, the operating point of energy converter 120 may or may not correspond to traditional or legacy definitions for amplifier classes (e.g., classes A, D, E, and F). However, as would be understood by a person skilled in the relevant art, the conduction angle at any instance in time and at any operating point can be determined for energy converter 120 and, thus, can be related to a traditional or legacy amplifier class definition.

Figure 6:
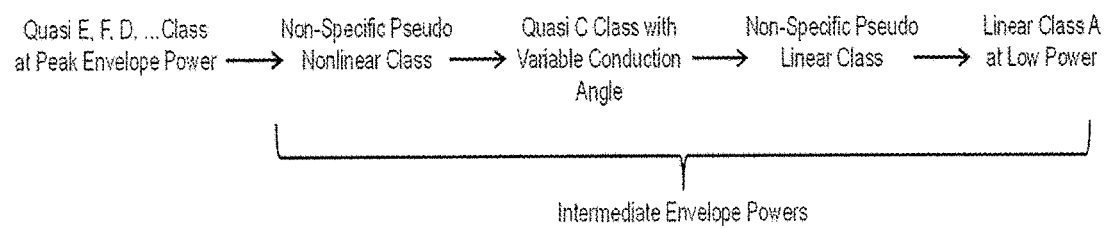
FIG. 6 is an illustration of an exemplary sequence of class transitioning for a MISO-based energy converter design, according to an embodiment of the present invention.

From the view of attempting to categorize the dynamic nature of energy converter 120, it is recommended that whenever the analogy (from the view of classical amplifier design) of class transitioning is used then the sequences depicted in FIG. 6 should be considered for the embodiments disclosed herein. Furthermore, in the case of a MISO-based design (e.g., MISO operator 310 of FIG. 3), the MISO class is an analogous term based on the variable dynamic load line concept discussed above and is not meant to necessarily imply that an actual amplifier must be employed as a MISO function. The IEEE recognizes and provides precise definitions for amplifier classes. Based on the description herein, a person skilled in the relevant art will recognize that the class of operation for energy converter 120 is not restricted to those definitions and can accommodate by definition a trajectory of points through the analogous variable dynamic load line space.

Figure 7:
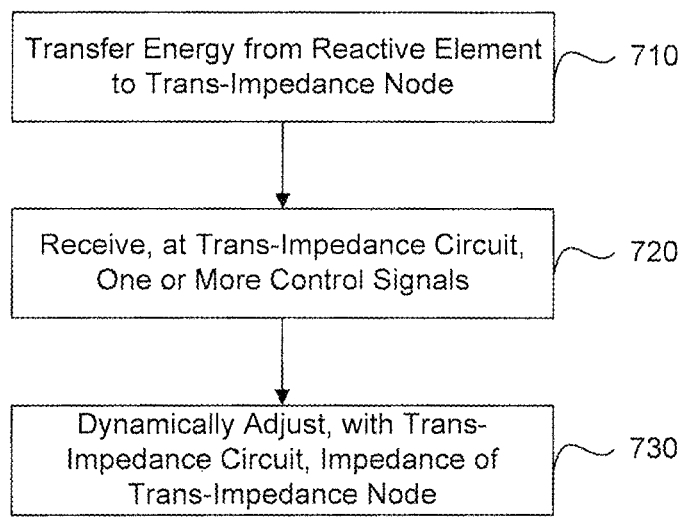
FIG. 7 is an illustration of an embodiment of a method for energy conversion.

FIG. 7 is an illustration of an embodiment of a method 700 for energy conversion. The steps of FIG. 7 can be performed using, for example, energy conversion system 100 of FIGS. 1-3.

In step 710, energy is transferred from a reactive element to a trans-impedance node. In an embodiment, the transferred energy can be derived from an AC power source or a DC power source such as, for example, power source 110 of FIGS. 1-3.

In step 720, a trans-impedance circuit receives one or more control signals. In an embodiment, the one or more control signals can be integrated into a function or operation of a multiple input/single output (MISO) operator (e.g., MISO operator 310 of FIG. 3).

In step 730, an impedance of the trans-impedance node can be dynamically adjusted by the trans-impedance circuit. As a result, the trans-impedance node can operate as an RF switching power supply based on the one or more control signals, according to an embodiment of the present invention. In an embodiment, the dynamically adjusting step can include reducing power flow into the trans-impedance node towards the MISO operator and increasing power flow towards an output away from the MISO operator. Further, in an embodiment, the dynamically adjusting step can include generating a plurality of variable dynamic load lines at the trans-impedance node based on the one or more control signals.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventors, and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the relevant art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An apparatus comprising:
a power source that provides electrical power;
an energy converter, coupled to the power source, the energy converter including:
a trans-impedance node;
a reactive circuit element configured to transfer energy from the power source to the trans-impedance node; and
a trans-impedance circuit configured to receive one or more control signals and to dynamically adjust an impedance of the trans-impedance node,
wherein the trans-impedance node generates an RF signal based on the one or more control signals;
a matching network, coupled to the energy converter, the matching network providing an impedance path between the energy converter and an output node; and
an antenna, coupled to the matching network, that transmits a modulated RF carrier signal.

2. The apparatus as claimed in claim 1, wherein the reactive circuit element is an inductor.

3. The apparatus as claimed in claim 1, wherein the reactive circuit element stores and transfers energy from an AC or a DC power source to the trans-impedance node.

4. The apparatus as claimed in claim 1, wherein trans-impedance circuit includes multiple input single output circuit.

5. The apparatus as claimed in claim 1, wherein the energy converter continuously generates variable classes of RF amplification.

6. The apparatus as claimed in claim 5, wherein the classes of RF amplification include linear amplification, switch mode amplification and hybrid modes of amplification.

7. The apparatus as claimed in claim 1, wherein the dynamic adjustment includes reducing power flow into the trans-impedance node.

* * * * *